(12) United States Patent
Tsuchiya et al.

(10) Patent No.: US 8,902,013 B2
(45) Date of Patent: Dec. 2, 2014

(54) DYNAMIC RANGE COMPRESSION CIRCUIT AND CLASS D AMPLIFIER

(75) Inventors: Hirotoshi Tsuchiya, Iwata (JP); Shinji Yaezawa, Iwata (JP)

(73) Assignee: Yamaha Corporation, Hamamatsu-shi (JP)

(*) Notice: Subject to any disclaimer, the term of this patent is extended or adjusted under 35 U.S.C. 154(b) by 268 days.

(21) Appl. No.: 13/353,101

(22) Filed: Jan. 18, 2012

(65) Prior Publication Data

US 2012/0182081 A1     Jul. 19, 2012

(30) Foreign Application Priority Data

Jan. 19, 2011   (JP) .................. 2011-009195

(51) Int. Cl.
| | | |
|---|---|---|
| *H03F 3/217* | (2006.01) | |
| *H03G 7/08* | (2006.01) | |
| *H03G 7/00* | (2006.01) | |

(52) U.S. Cl.
CPC ................ *H03F 3/217* (2013.01); *H03G 7/08* (2013.01); *H03G 7/004* (2013.01)
USPC .............................. 333/14; 330/136; 330/284

(58) Field of Classification Search
USPC ............................ 333/14; 330/284, 136, 14
See application file for complete search history.

(56) References Cited

U.S. PATENT DOCUMENTS

| | | | |
|---|---|---|---|
| 2001/0006359 A1 | 7/2001 | Suzuki et al. | |
| 2006/0247920 A1 | 11/2006 | Toriyama | |
| 2007/0103234 A1 | 5/2007 | Maejima et al. | |
| 2007/0285160 A1* | 12/2007 | Kim et al. ..................... | 330/144 |
| 2009/0299742 A1 | 12/2009 | Toman et al. | |

FOREIGN PATENT DOCUMENTS

| | | |
|---|---|---|
| CN | 1159871 C | 7/2004 |
| EP | 1 770 855 A1 | 4/2007 |
| JP | 57-14515 U | 1/1982 |
| JP | 4-142104 A | 5/1992 |
| JP | 5-110362 A | 4/1993 |
| JP | 2005-302186 A | 10/2005 |
| JP | 2006-311382 A | 11/2006 |
| JP | 2007-104407 A | 4/2007 |
| JP | 2010-34700 A | 2/2010 |
| WO | WO 2009/148960 A2 | 12/2009 |

OTHER PUBLICATIONS

Chinese Office Action with English Translation dated Dec. 4, 2013 (twenty-four (24) pages).
Japanese Office Action dated Jun. 3, 2014 with English translation (six pages).
Chinese Office Action dated Jul. 18, 2014, including English translation (20 pages).

* cited by examiner

*Primary Examiner* — Stephen Jones
*Assistant Examiner* — Scott S Outten
(74) *Attorney, Agent, or Firm* — Crowell & Moring LLP

(57) ABSTRACT

A dynamic range compression circuit includes an attenuator that attenuates a signal at a predetermined node in an amplifier to reduce a gain of the amplifier and a gain controller that reduces the gain of the amplifier by the attenuator so that an amplitude of an output signal of the amplifier becomes an arbitrary output limit voltage in a case where an input signal having the same amplitude as that of an input-stage maximum voltage of the amplifier is input into the amplifier, and increases the gain of the amplifier by reducing a degree of attenuation of the attenuator according to a decrease of the amplitude of the input signal of the amplifier from the input-stage maximum voltage in a case where the amplitude of the input signal of the amplifier is smaller than the input-stage maximum voltage.

8 Claims, 11 Drawing Sheets

FIG.12A
FIG.12B
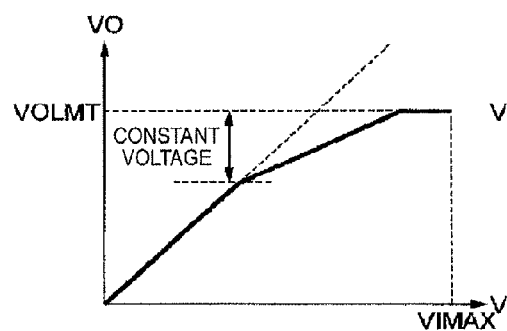
RELATED ART
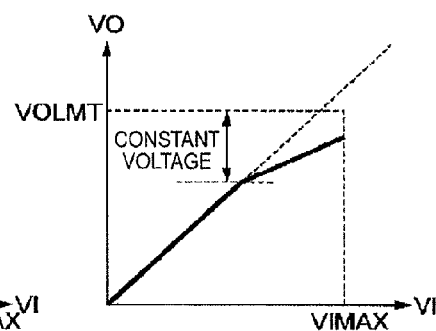
RELATED ART

DYNAMIC RANGE COMPRESSION CIRCUIT AND CLASS D AMPLIFIER

BACKGROUND

The present invention relates to a dynamic range compression circuit appropriate for dynamic range compression on audio signals and a class D amplifier including the dynamic range compression circuit.

Audio apparatuses often use dynamic range compression technology for enabling reproduced sounds of input audio signals having a wide dynamic range from a speaker to be easily heard by a listener. The dynamic range compression is a technology which outputs an input audio signal having a wide dynamic range as a reproduced sound having the volume of sound in a range comfortably audible for listeners by increasing a gain of amplification in a range in which the volume of sound of an input audio signal is low, and decreasing a high gain of amplification in a range in which the volume of sound of the input audio signal is high when the input audio signal is amplified and reproduced (see, for example, JP-A-5-110362, JP-A-2005-302186, and JP-A-2007-104407).

In the related art, a voltage lower than an output limit voltage VOLMT by a predetermined voltage, which is a limit for preventing a clip from being generated in an output signal waveform of an amplifier, is set as a threshold, and in range in which the amplitude of an output signal VO of the amplifier is the threshold or more, the gain of the amplifier is reduced so as to perform dynamic range compression. Therefore, in a case where an input-stage maximum voltage VIMAX, which is the maximum amplitude of an input signal transmitted from a circuit at the previous stage to the amplifier, is large, as shown in FIG. 12A, before the amplitude of the input signal VI of the amplifier reaches the input-stage maximum voltage VIMAX, the amplitude of the output signal VO of the amplifier reaches the output limit voltage VOLMT, such that a further increase in amplitude of the input signal VI cannot be reflected as an increase in amplitude of the output signal VO. Further, in a case where the input-stage maximum voltage VIMAX is low, as shown in FIG. 12B, even if the input signal VI of the amplifier reaches the input-stage maximum voltage VIMAX, the amplitude of the output signal VO of the amplifier becomes lower than the output limit voltage VOLMT.

SUMMARY

The present invention is made considering the above-mentioned circumferences, and an object of the present invention is to provide a dynamic range compression circuit making it possible to utilize the most of an amplitude range which an amplifying unit can output and to reflect a change in amplitude of an input signal in an input-stage maximum voltage range to a change in amplitude of an output signal and a class D amplifier including the dynamic range compression circuit.

In order to achieve the above object, according to the present invention, there is provided dynamic range compression circuit, comprising:

an attenuator that attenuates a signal at a predetermined node in an amplifier to reduce a gain of the amplifier; and a gain controller that reduces the gain of the amplifier by the attenuator so that an amplitude of an output signal of the amplifier becomes an arbitrary output limit voltage in a case where an input signal having the same amplitude as that of an input-stage maximum voltage of the amplifier is input into the amplifier, and increases the gain of the amplifier by reducing a degree of attenuation of the attenuator according to a decrease of the amplitude of the input signal of the amplifier from the input-stage maximum voltage in a case where the amplitude of the input signal of the amplifier is smaller than the input-stage maximum voltage.

Preferably, the gain controller includes a reference voltage generator that generates a reference voltage by dividing the input signal of the amplifier at a voltage division ratio depending on a voltage value of the input signal and an attenuation controller that controls the attenuator to attenuate the signal at the predetermined node in the amplifier so as to reduce the gain of the amplifier if a voltage obtained by dividing the input signal of the amplifier at a predetermined voltage division ratio exceeds the reference value, and the reference voltage generator divides the input signal of the amplifier at a voltage division ratio so that a reference voltage having a magnitude which attenuates the amplitude of the output signal of the amplifier to the output limit voltage is generated in a case where the amplitude of the input signal of the amplifier is the input-stage maximum voltage of the amplifier, and increases the voltage division ratio for generating the reference voltage according to the decrease of the amplitude of the input signal of the amplifier from the input-stage maximum voltage in the case where the amplitude of the input signal of the amplifier is smaller than the input-stage maximum voltage.

Preferably, the reference voltage generator includes first and second voltage-dependent voltage-dividing circuits, the first voltage-dependent voltage-dividing circuit includes first and second resistors that are connected in series with each other and receives the input-stage maximum voltage, a first voltage-dependent resistor that has a resistance value depending on a control voltage and increasing according to a decrease in a voltage between both ends which are connected to a node between the first resistor and the second resistor and another predetermined node respectively, and a controller that controls the control voltage for the first voltage-dependent resistor so that a voltage at the node between the first resistor and the second resistor becomes an input limit voltage which is an input voltage of the amplifier for outputting the output limit voltage to the amplifier, and the second voltage-dependent voltage-dividing circuit includes third and fourth resistors that are connected in series with each other and receives the input signal of the amplifier, and a second voltage-dependent resistor that receives the control voltage input to the first voltage-dependent resistor, and has a resistance value depending on the control voltage and increasing according to a decrease in a voltage between both ends which are connected to a node between the third resistor and the fourth resistor and another predetermined node respectively, and the reference voltage is generated on the basis of a voltage at the node between the third resistor and the fourth resistor.

Preferably, the reference voltage generator includes a peak holding circuit that generates the reference voltage by holding a peak of an output signal which is a voltage division result of the second voltage-dependent voltage-dividing circuit.

Preferably, the attenuator attenuates a signal at a node on a path of the input signal of the amplifier.

Preferably, the attenuation controller controls the attenuator to intermittently attenuate the signal at the predetermined node in the amplifier so as to reduce the gain of the amplifier if the voltage obtained by dividing the input signal of the amplifier at the predetermined voltage division ratio exceeds the reference value.

Preferably, the dynamic range compression circuit further comprises an attenuation signal generator that outputs an attenuation signal to the attenuator. The attenuation controller controls the attenuation signal generator to output the attenuation signal intermittently to the attenuator so that the attenuator intermittently attenuates the signal at the predetermined node in the amplifier so as to reduce the gain of the amplifier if the voltage obtained by dividing the input signal of the amplifier at the predetermined voltage division ratio exceeds the reference value.

Preferably, the gain of the amplifier increased by the gain controller is limited to a predetermined maximum gain.

According to the present invention, there is also provided a class D amplifier comprising:
an amplifier; and
a dynamic range compression circuit including:
an attenuator that attenuates a signal at a predetermined node in the amplifier to reduce a gain of the amplifier; and
a gain controller that reduces the gain of the amplifier by the attenuator so that an amplitude of an output signal of the amplifier becomes an arbitrary output limit voltage in a case where an input signal having the same amplitude as that of an input-stage maximum voltage of the amplifier is input into the amplifier, and increases the gain of the amplifier by reducing a degree of attenuation of the attenuator according to a decrease of the amplitude of the input signal of the amplifier from the input-stage maximum voltage in a case where the amplitude of the input signal of the amplifier is smaller than the input-stage maximum voltage.

According to the present invention, in a case where the amplitude of the input signal of the amplifier is the input-stage maximum amplitude, the gain of the amplifier is controlled such that the amplitude of the output signal of the amplifier becomes the output limit voltage. Further, in a range in which the amplitude of the input signal of the amplifier is smaller than the input-stage maximum amplitude, on the basis of a degree of decrease of the amplitude of the input signal from the input-stage maximum amplitude, a control is performed such that the gain of the amplifier increases from the gain of the amplifier in a case of performing amplification of the input signal of the input-stage maximum amplitude. Therefore, it is possible to make the most of the amplitude range which the amplifier can output, and to reflect a change of the amplitude of the input signal in the input-stage maximum amplitude, in a change in amplitude of the output signal.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 12A and 12B are views illustrating examples of a dynamic range compression characteristic implemented according to the related art.

DETAILED DESCRIPTION OF EXEMPLARY EMBODIMENTS

Hereinafter, an embodiment of the present invention will be described with reference to the accompanying drawings.

First Embodiment

Figure 1:
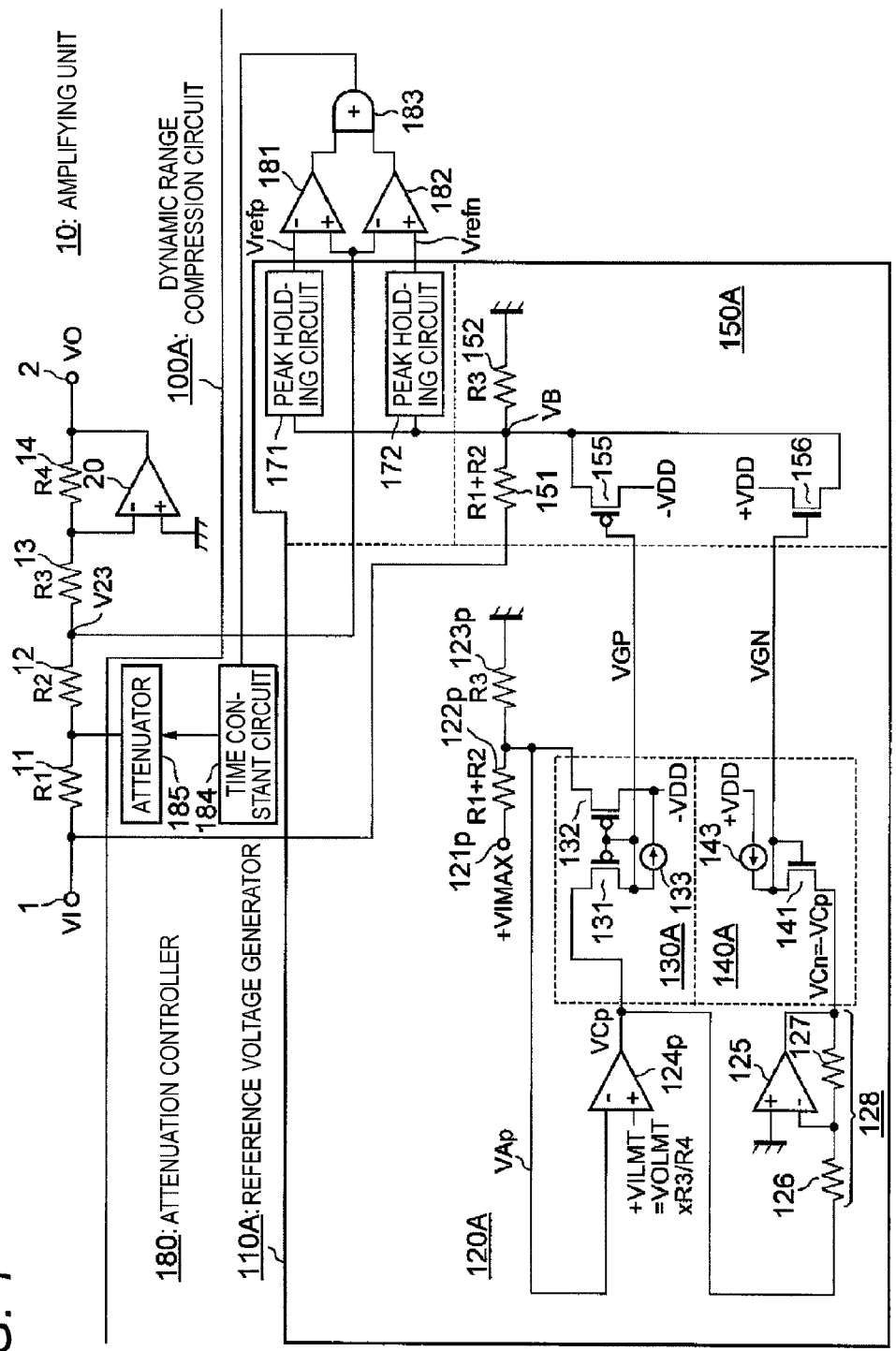
FIG. 1 is a circuit diagram illustrating a configuration of a power amplifier including a dynamic range compression circuit according to a first embodiment of the present invention.

FIG. 1 is a circuit diagram illustrating a configuration of a power amplifier including a dynamic range compression circuit 100A according to a first embodiment of the present invention. In FIG. 1, an amplifying unit 10 is a single-end-type amplifying circuit, and includes a resistor 11 having a resistance value R1, a resistor 12 having a resistance value R2, a resistor 13 having a resistance value R3, a resistor 14 having a resistance value R4, and a differential amplifier 20. Here, the resistors 11, 12, 13, and 14 are interposed in series between an input terminal 1 and an output terminal 2 of the power amplifier. Further, the differential amplifier 20 includes a normal-phase input terminal (positive terminal) grounded, and a reverse-phase input terminal (negative terminal) connected to a node between the resistors 13 and 14. Furthermore, the differential amplifier 20 includes an output terminal connected to the output terminal 2 of the power amplifier. The output terminal 2 is connected to a load (not shown) including a speaker, a low pass filter, and the like.

At the previous stage of the amplifying unit 10, an input-stage circuit (not shown) is provided. The input-stage circuit supplies an audio input signal VI having an amplitude within a predetermined range between input-stage maximum voltages ±VIMAX, to the input terminal 1 of the amplifying unit 10. Here, the input-stage maximum voltages ±VIMAX are determined, for example, according to a power supply voltage of the input-stage circuit.

The amplifying unit 10 amplifies the audio input signal VI input to the input terminal 1, so as to generate an audio output signal VO, and outputs the audio output signal VO from the output terminal 2. In the first embodiment, the amplitude of the audio output signal VO output by the amplifying unit 10 is limited to a predetermined range between output limit voltages ±VOLMT. The output limit voltages ±VOLMT are designated, for example, by manipulating a manipulation unit provided to a housing of an audio apparatus which includes the power amplifier shown in FIG. 1.

The dynamic range compression circuit 100A is a circuit for controlling the gain of the amplifying unit 10 according to the amplitude of the audio input signal VI such that a relation between the audio input signal VI and the audio output signal VO of the amplifying unit 10 depends on a predetermined dynamic range compression characteristic.

Figure 2A:
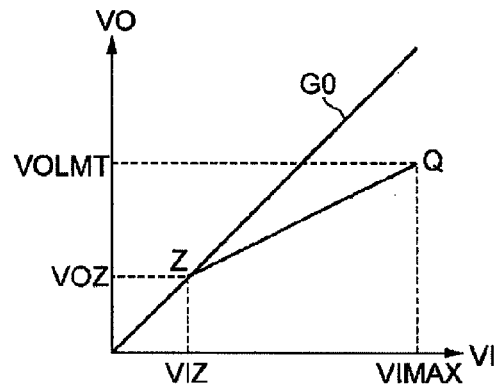
FIGS. 2A and 2B are views illustrating examples of a dynamic range compression characteristic implemented in the first embodiment.
Figure 2B:
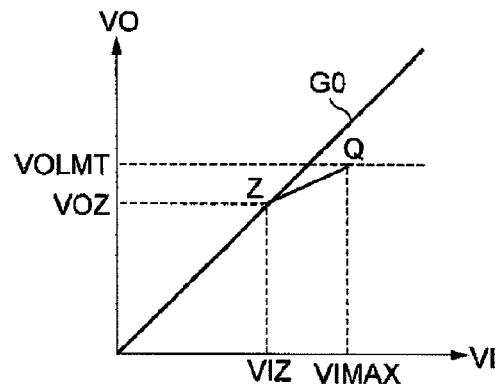

FIGS. 2A and 2B show examples of the dynamic range compression characteristic implemented in the first embodiment. Specifically, FIG. 2A shows a case where the input-stage maximum voltage VIMAX is large, and FIG. 2B shows a case where the input-stage maximum voltage VIMAX is small. Features of the dynamic range compression characteristic implemented in the first embodiment are as follow.

First, in a case where the amplitude of the audio input signal VI is the input-stage maximum voltage VIMAX, the amplitude of the audio output signal VO becomes the output limit voltage VOLMT. In the first embodiment, a point (VIMAX, VLMT) in a VI–VO coordinate system defined by the audio input signal VI (=VIMAX) and the audio output signal VO (=VOLMT) is called a destination point Q. At the destination point Q, the gain G of the amplifying unit 10 becomes the minimum value GMIN (=VOLMT/VIMAX).

Second, in a range in which the amplitude of the audio input signal VI is the input-stage maximum voltage VIMAX or the less, as decrease of the amplitude of the audio input signal VI from the input-stage maximum voltage VIMAX increases, the gain of the amplifying unit 10 increases from the minimum value GMIN. In other hand, in the range in which the amplitude of the audio input signal VI is equal to or smaller than the input-stage maximum voltage VIMAX, in accordance with the increase in a difference between the amplitude of the audio input signal VI and the input-stage maximum voltage VIMAX, the gain of the amplifying unit 10 increases from the minimum value GMIN.

Third, if the amplitude of the audio input signal VI decreases from the input-stage maximum voltage VIMAX, the gain G of the amplifying unit 10 reaches the maximum gain G0 (=R4/(R1+R2+R3)) in a short time. In a range in which the amplitude of the audio input signal VI is lower than a point Z at which the gain G reaches the maximum gain G0, the gain G of the amplifying unit 10 becomes the maximum gain G0, regardless of the amplitude of the audio input signal VI. In the first embodiment, in a case where the amplitude of the audio input signal VI decreases from the input-stage maximum voltage VIMAX, a graph representing the dynamic range compression characteristic is curved from the point Z at which the gain G reaches the maximum gain G0. Therefore, in the first embodiment, the point Z is referred to as a bending point, and a voltage value of the audio output signal VO at the bending point Z is referred to as a bending-point output voltage VOZ, and a voltage value of the audio input signal VI at the bending point Z is referred to as a bending-point input voltage VIZ.

The dynamic range compression circuit 100A according to the first embodiment includes a reference voltage generator 110A and an attenuation controller 180, as shown in FIG. 1. The reference voltage generator 110A and the attenuation controller 180 constitute a gain control section (a gain controller) for implementing the dynamic range compression characteristic. Here, the reference voltage generator 110A is a circuit which generates reference voltages Vrefp and Vrefn as control signals for dynamic range compression by dividing the voltage of the audio input signal VI to the amplifying unit 10. The attenuation controller 180 is a circuit which controls the gain of the amplifying unit 10 such that voltages obtained by dividing the voltage of the audio input signal VI to the amplifying unit 10 at a predetermined voltage division ratio, more specifically, positive and negative peaks of a voltage V23 at a node between the resistors 12 and 13 correspond to the reference voltages Vrefp and Vrefn.

In the first embodiment, the reference voltage generator 110A generates voltages having voltage values obtained by multiplying ±R3/R4 and the amplitude value of the audio output signal VO in the examples of the dynamic range compression characteristic shown in FIGS. 2A and 2B, as the reference voltages Vrefp and Vrefn according to the amplitude of the audio input signal VI.

The attenuation controller 180 includes comparators 181 and 182, an OR gate 183, a time constant circuit 184, and an attenuator 185. The comparator 181 is a circuit which outputs a low level when the voltage V23 at the node between the resistors 12 and 13 of the amplifying unit 10 is lower than the reference voltage Vrefp, and outputs a high level when the voltage V23 is higher than the reference voltage Vrefp. The comparator 182 is a circuit which outputs a low level when the voltage V23 is higher than the reference voltage Vrefn and outputs a high level when the voltage V23 is lower than the reference voltage Vrefn. The OR gate 183 outputs a low level when output signals of both of the comparators 181 and 182 are at the low level, and outputs a high level when at least one of the output signals of the comparators 181 and 182 is at the high level. The time constant circuit 184 is a circuit which raises an output signal over a predetermined attack time when an output signal of the OR gate 183 rises, and lowers the output signal over a predetermined release time when the output signal of the OR gate 183 falls. The attenuator 185 attenuates the amplitude of the signal at a node between the resistors 11 and 12 in accordance with a rise in level of the output signal of the time constant circuit 184, so as to reduce the gain of the amplifying unit 10.

Next, a configuration of the reference voltage generator 110A according to the first embodiment will be described in detail. As shown in FIG. 1, the reference voltage generator 110A includes a first voltage-dependent voltage-dividing circuit 120A, a second voltage-dependent voltage-dividing circuit 150A, and two peak holding circuits 171 and 172. The first voltage-dependent voltage-dividing circuit 120A has a voltage input terminal 121p which receives a positive input-stage maximum voltage +VIMAX. Between the voltage input terminal 121p and a ground line, a resistor 122p having a resistance value of (R1+R2) a resistor 123p having a resistance value R3 are interposed in series.

A differential amplifier 124p is a circuit which compares a voltage VAp at a node between the resistors 122p and 123p with a positive input limit voltage +VILMT, and changes an output signal in a positive direction when the voltage VAp is lower than the positive input limit voltage +VILMT, and changes the output signal in a negative direction when the voltage VAp is higher than the positive input limit voltage +VILMT. Here, the positive input limit voltage +VILMT is an arbitrary voltage which is set from the outside of the power amplifier. In this example, the positive input limit voltage +VILMT is a voltage at the node between the resistors 12 and 13 when the output voltage VO of the amplifying unit 10 becomes the output limit voltage −VOLMT, and becomes +VOLMT·R3/R4. Between an output terminal of the differential amplifier 124p and the node between the resistors 122p and 123p, a voltage-dependent resistor 130A is interposed.

The voltage-dependent resistor 130A is a resistor having a resistance value variable depending on an output voltage VCp of the differential amplifier 124p. The differential amplifier 124p and the voltage-dependent resistor 130A constitute a negative feedback loop. This negative feedback loop is used to perform a control such that the voltage VAp at the node between the resistors 122p and 123p corresponds to the input limit voltage +VILMT.

The voltage-dependent resistor 130A includes P-channel field-effect transistors (hereinafter, referred to simply as P-channel transistors) 131 and 132, and a constant current source 133. Here, the P-channel transistor 131 has a source connected to the output terminal of the differential amplifier 124p, and a drain and a gate connected to a negative power source −VDD through the constant current source 133. The P-channel transistor 132 has a source connected to the node between the resistors 122p and 123p and a reverse-phase input terminal of the differential amplifier 124p, a gate connected to the gate and drain of the P-channel transistor 131, and a drain connected to the negative power source −VDD.

In this configuration, a voltage VGP at a connection node of the gate and drain of the P-channel transistor 131 and the gate of the P-channel transistor 132 becomes a voltage lower than the output voltage VCp of the differential amplifier 124p by a threshold voltage of the P-channel transistor 131.

Here, if the voltage VAp at the node between the resistors 122p and 123p becomes higher than the input limit voltage +VILMT such that the output voltage VCp of the differential amplifier 124p changes in the negative direction, the gate voltage VGP of the P-channel transistors 131 and 132 also changes in the negative direction. As a result, the ON resistance of the P-channel transistor 132 decreases, and the voltage VAp at the node between the resistors 122p and 123p is reduced.

If the voltage VAp at the node between the resistors 122p and 123p becomes lower than the input limit voltage +VILMT such that the output voltage VCp of the differential amplifier 124p changes in the positive direction, the gate voltage VGP of the P-channel transistors 131 and 132 also changes in the positive direction. As a result, the ON resistance of the P-channel transistor 132 increases, and the voltage VAp at the node between the resistors 122p and 123p rises. As a result of the action of this negative feedback, the voltage VAp at the node between the resistors 122p and 123p corresponds to the input limit voltage +VILMT.

As described above, in the first embodiment, if the input-stage maximum voltage VIMAX is input to the resistors 122p and 123p, the gate voltage VGP of the P-channel transistor 132 is adjusted such that the ON resistance of the P-channel transistor 132 becomes ON resistance which makes the voltage VAp at the node between the resistors 122p and 123p correspond to the input limit voltage +VILMT.

The gate voltage VGP becomes a voltage value depending on the transistor size of the P-channel transistor 132. The first embodiment presupposes that the input limit voltage +VILMT is lower than a voltage VAp (=VIMAX·R3/(R1+R2+R3)) at the node between the resistors 122p and 123 p when the P-channel transistor 132 is in an OFF state. In the first embodiment, a current is made flow in the P-channel transistor 132 interposed between the negative power source −VDD and the node between the resistors 122p and 123p, so as to reduce the voltage at the node between the resistors 122p and 123p. In this way, the gate voltage VGP of the P-channel transistor 132 is adjusted such that the voltage at the node between the resistors 122p and 123p becomes the input limit voltage VILMT. Here, in a case where the transistor size of the P-channel transistor 132 is small, in order to make a current, sufficient to reduce the voltage at the node between the resistors 122p and 123p up to the input limit voltage VILMT, flow in the P-channel transistor 132, it is required to increase a voltage |IVGP−VILMT| between the gate and source of the P-channel transistor 132, and the gate voltage VGP becomes a voltage value largely distant from the input limit voltage VILMT in the negative direction. Meanwhile, in a case where the transistor size of the P-channel transistor 132 is large, even if the voltage |IVGP−VILMT| between the gate and source of the P-channel transistor 132 is not made so large, it is possible to make a current, which is sufficient to reduce the voltage at the node between the resistors 122p and 123p up to the input limit voltage VILMT, flow in the P-channel transistor 132. Therefore, the gate voltage VGP becomes a voltage value higher than that in the former case.

The above-mentioned bending-point input voltage VIZ is determined by the gate voltage VGP. Therefore, the transistor size of the P-channel transistor 132 may be determined according to a desired bending-point input voltage VIZ.

A differential amplifier 125 and resistors 126 and 127 constitute a polarity reversing circuit 128 which generates a voltage VCn (=−VCp) having a reverse polarity to that of the output voltage VCp of the differential amplifier 124p. The voltage VCn generated by the polarity reversing circuit 128 is supplied to a voltage-dependent resistor 140A.

The voltage-dependent resistor 140A includes an N-channel field-effect transistor (hereinafter, referred to simply as an N-channel transistor) 141, and a constant current source 143. The N-channel transistor 141 has a source which receives the output voltage VCn of the polarity reversing circuit 128, and a drain and a gate connected to a positive power source +VDD through the constant current source 143. A gate voltage VGN of the N-channel transistor 141 becomes a voltage higher than the output voltage VCn (=−VCp) of the polarity reversing circuit 128 by a threshold voltage by the N-channel transistor 141. The absolute values of the threshold voltages of the N-channel transistor 141 and the P-channel transistor 131 become substantially the same value. Therefore, the gate voltage VGN of the N-channel transistor 141 becomes a substantially same value as a voltage obtained by reversing the polarity of the gate voltage VGP of the P-channel transistor 132.

A second voltage-dependent voltage-dividing circuit 150A includes resistors 151 and 152 interposed in series between the input terminal 1 and the ground line, and a P-channel transistor 155 and an N-channel transistor 156 each of which acts as a voltage-dependent resistor. Here, the resistor 151 has a resistance value of (R1+R2), and the resistor 152 has the resistance value R3. The P-channel transistor 155 has a source connected to a node between the resistors 151 and 152, a gate connected to the gate of the P-channel transistor 132 of the voltage-dependent voltage-dividing circuit 120A, and a drain connected to the negative power source −VDD. The P-channel transistor 155 has the same transistor size as that of the P-channel transistor 132. The N-channel transistor 156 has a source connected to the node between the resistors 151 and 152, a gate connected to the gate of the N-channel transistor 141 of the voltage-dependent voltage-dividing circuit 120A, and a drain connected to the positive power source +VDD. The transistor size of the N-channel transistor 156 is determined according to the transistor size of the P-channel transistor 155 such that, in a case where source-drain voltages having the same absolute value are applied to the N-channel transistor 156 and the P-channel transistor 155, drain currents having the same absolute value flow in the N-channel transistor 156 and the P-channel transistor 155.

The peak holding circuit 171 is a circuit which generates the positive reference voltage Vrefp on the basis of a voltage VB at the node between the resistors 151 and 152, and the peak holding circuit 172 is a circuit which generates the negative reference voltage Vrefn on the basis of the voltage VB at the node between the resistors 151 and 152. More specifically, the peak holding circuit 171 raises the reference voltage Vrefp according to a positive peak of the voltage VB at the node between the resistors 151 and 152, and attenuates the reference voltage Vrefp toward 0 V according to a predetermined time constant after the positive peak of the voltage VB. The peak holding circuit 172 lowers the reference voltage Vrefn according to a negative peak of the voltage VB at the node between the resistors 151 and 152, and attenuates the absolute value of the reference voltage Vrefn toward 0 V according to a predetermined time constant after the negative peak of the voltage VB.

In the first embodiment, the peak holding circuits 171 and 172 prevent a phase difference between the voltage V23 between the resistors 12 and 13 and the voltage VB at the node between the resistors 151 and 152 from causing an error.

This will be described below in detail. If the peak holding circuits 171 and 172 do not exist, even in a state in which the amplitude of the audio input signal VI is small and both of the P-channel transistor 155 and the N-channel transistor 156 are in an OFF state, in a case where a phase difference occurs between the voltage V23 and the voltage VB, whenever a magnitude relation between the voltage V23 and the voltage VB is reversed, the level of the output signal of each of the comparators 181 and 182 is reversed, and the signal at the node between the resistors 11 and 12 is unnecessarily attenuated by the attenuator 185.

For this reason, in the first embodiment, the voltage VB is not directly 2o applied to the comparators 181 and 182 but is applied to the peak holding circuits 171 and 172, such that the reference voltages Vrefp and Vrefn obtained from the peak holding circuits 171 and 172 are applied to the comparators 181 and 182. According to this configuration, in a case where the amplitude of the audio input signal VI is small and the voltage V23 between the resistors 12 and 13 falls within a range between the reference voltages Vrefp and Vrefn, the output signals of the comparators 181 and 182 do not become high level, such that a malfunction as described above does not occur.

The dynamic range compression circuit 100A according to the first embodiment has been described above in detail.

Figure 3:
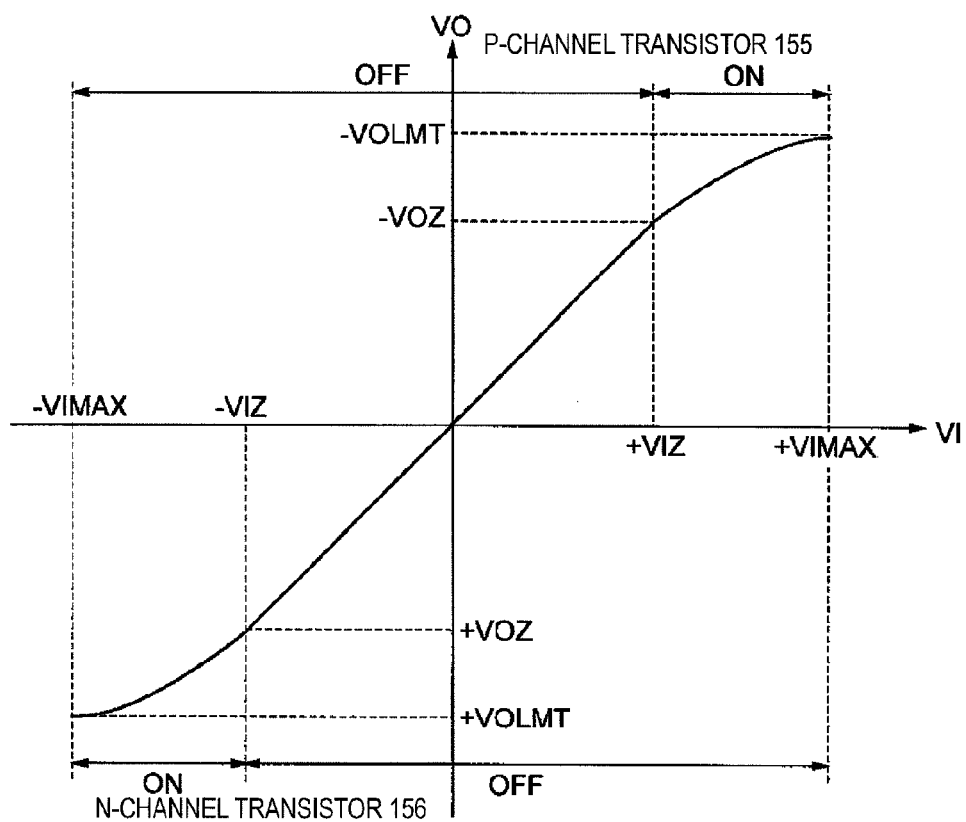
FIG. 3 is a view illustrating a change in voltage value of an audio output signal VO and changes of a P-channel transistor and an N-channel transistor of a voltage-dependent voltage-dividing circuit between an ON state and an OFF state when a voltage value of an audio input signal VI to an amplifying unit changes in a range from a negative input-stage maximum voltage −VIMAX to a positive input-stage maximum voltage +VIMAX, according to the first embodiment.

Next, an operation of the first embodiment will be described. FIG. 3 is a view illustrating a change in voltage value of the audio output signal VO and changes of the P-channel transistor 155 and the N-channel transistor 156 of the second voltage-dependent voltage-dividing circuit 150A between an ON state and an OFF state when the voltage value of the audio input signal VI to the amplifying unit 10 changes in a range from the negative input maximum voltage −VIMAX to the positive input maximum voltage +VIMAX.

In a case where the voltage value of the audio input signal VI is the input maximum voltage +VIMAX, the voltage VB at the node between the resistors 151 and 152 of the second voltage-dependent voltage-dividing circuit 150A becomes the input limit voltage +VILMT. This is because of the following reasons. A first reason is that the same input maximum voltage VIMAX as that applied to the resistors 122p and 123p of the first voltage-dependent voltage-dividing circuit 120A is applied to the resistors 151 and 152 of the second voltage-dependent voltage-dividing circuit 150A. A second reason is that the same gate voltage VGP as that applied to the P-channel transistor 132 of the first voltage-dependent voltage-dividing circuit 120A is applied to the P-channel transistor 155 such that the ON resistance Ron of the P-channel transistor 155 becomes the same as the ON resistance of the P-channel transistor 132. A third reason is that, in most cases, since a negative gate voltage VGN is applied to the N-channel transistor 156, the N-channel transistor 156 becomes the OFF state after the input maximum voltage VIMAX is applied to the input terminal 1.

Therefore, if a positive peak having the same magnitude as that of the input maximum voltage +VIMAX occurs in the audio input signal VI, a positive peak having the same voltage value as that of the input limit voltage +VILMT occurs at the node between the resistors 151 and 152 and a peak, value +VILMT of the positive peak is held as the positive reference voltage Vrefp in the peak holding circuit 171. In this state, if the voltage V23 at the node between the resistors 12 and 13 of the amplifying unit 10 exceeds the reference voltage Vrefp (=+VILMT), a high-level signal is output from the OR gate 183 and the signal at the node between the resistors 11 and 12 is attenuated by the attenuator 185. As a result of the action of this negative feedback control, the voltage V23 at the node between the resistors 12 and 13 decreases up to the reference voltage Vrefp (=+VILMT), and the amplitude of the audio output signal VO output by the amplifying unit 10 becomes the output limit voltage VOLMT (=−VILMT·R4/R3).

Next, if the voltage value of the audio input signal VI decreases from the input-stage maximum voltage VIMAX towards 0 V, since the voltage VB at the node between the resistors 151 and 152 decreases toward 0 V, the gate-source voltage of the P-channel transistor 155 decreases, such that the ON resistance of the P-channel transistor 155 gradually increases.

A relation between the voltage V23 at the node between the resistors 12 and 13 and the voltage VB at the node between the resistors 151 and 152 in that procedure will now be described. First, the voltage V23 at the node between the resistors 12 and 13 is given by the following equation.

$$V23 = VI \cdot R3/(R1 + R2 + R3) \quad (1)$$
$$= VI \cdot \alpha 1$$

Here, α1 is a voltage division ratio and is R3/(R1+R2+R3).

Meanwhile, the voltage VB at the node between the resistors 151 and 152 is given by the following equation.

$$VB = VI \cdot Rx/(R1 + R2 + Rx) \quad (2)$$
$$= VI \cdot \alpha 2$$

Here, α2 is a voltage division ratio and is Rx/(R1 R2+Rx). A resistance value Rx is a combined resistance of a circuit composed of the resistor 152 (having the resistance value R3) and the ON resistance (resistance value Ron) of the P-channel transistor 155 or the N-channel transistor 156 connected in parallel with the resistor 152, and is given by the following equation.

$$Rx = R3 \cdot Ron/(R3+Ron) \quad (3)$$

In a case where the ON resistance Ron of the P-channel transistor 155 is the same as the ON resistance of the P-channel transistor 132, since Rx<R3 is established, α2<α1 is established. In the state of α2<α1, if attenuation by the attenuator 185 is not performed, the voltage V23 at the node between the resistors 12 and 13 becomes larger than the reference voltage Vrefp generated from the voltage VB at the node between the resistors 151 and 152. Therefore, the attenuator 185 attenuates the signal at the node between the resistors 11 and 12, and the negative feedback control is performed such that the voltage V23 at the node between the resistors 12 and 13 corresponds to the reference voltage Vrefp.

Then, if the voltage VB at the node between the resistors 151 and 152 decreases toward 0 V such that the ON resistance Ron of the P-channel transistor 155 gradually increases, the resistance value Rx in the above-mentioned equation (2) approaches to the resistance value R3 and thus the voltage division ratio α2 approaches to the voltage division ratio α1. Therefore, an attenuation amount of the attenuator 185 on the signal at the node between the resistors 11 and 12 gradually decreases, and the gain of the amplifying unit 10 gradually increases.

The operation of the first embodiment in the procedure in which the voltage value of the audio input signal VI decreases from the input-stage maximum voltage VIMAX toward 0 V has been described above.

If the voltage value of the audio input signal VI to the input terminal 1 decreases such that the voltage VB at the node between the resistors 151 and 152 becomes lower than a voltage obtained by adding the threshold voltage of the P-channel transistor 155 to the gate voltage VGP of the P-channel transistor 155, the P-channel transistor 155 becomes the OFF state. The audio input signal VI to the input terminal 1 when the P-channel transistor 155 is switched from the ON state to the OFF state becomes the above-mentioned bending-point input voltage +VIZ.

In a range in which the voltage value of the audio input signal VI is positive and is the bending-point input voltage VIZ or less, since the P-channel transistor 155 becomes the OFF state, and the resistance value Rx in the above-mentioned equation (2) becomes the resistance value R3, the voltage VB at the node between the resistors 151 and 152 corresponds to the voltage V23 at the node between the resistors 12 and 13. Therefore, the signal at the node between the resistors 11 and 12 is not attenuated by the attenuator 185, and thus the gain of the amplifying unit 10 becomes a maximum gain G0 (=R4/(R1+R2+R3)).

Meanwhile, in a case where the negative input maximum voltage −VIMAX is applied to the input terminal 1, the voltage VB at the node between the resistors 151 and 152 of the second voltage-dependent voltage-dividing circuit 150A corresponds to the negative input limit voltage −VILMT. This is because of the following reasons. A first reason is that the input-stage maximum voltage −VIMAX having the same magnitude as that applied to the resistors 122p and 123p of the first voltage-dependent voltage-dividing circuit 120A and a reverse polarity to that applied to the resistors 122p and 123p is applied to the resistors 151 and 152 of the second voltage-dependent voltage-dividing circuit 150A. A second reason is that, identically, the negative gate voltage VGN having the same absolute value as that applied to the P-channel transistor 132 of the first voltage-dependent voltage-dividing circuit 120A is applied to the N-channel transistor 156 such that the ON resistance of the N-channel transistor 156 becomes the same as the ON resistance of the P-channel transistor 155 when the positive input-stage maximum voltage +VIMAX is applied to the input terminal 1. A third reason is that, in most cases, since the positive gate voltage VGP is applied to the P-channel transistor 155, the P-channel transistor 155 becomes the OFF state after the input maximum voltage −VIMAX is applied to the input terminal 1.

Next, if the voltage applied to the input terminal 1 rises from the input-stage maximum voltage −VIMAX toward 0 V, the voltage VB at the node between the resistors 151 and 152 rises toward 0 V. Therefore, the gate-source voltage of the N-channel transistor 156 decreases, the ON resistance Ron of the N-channel transistor 156 increases, the resistance value Rx of the above-mentioned equation (2) approaches to the resistance value R3, and the voltage division ratio α2 increases so as to approach to the voltage division ratio α1. As a result, the gain of the amplifying unit 10 gradually increases. Then, if the input voltage to the input terminal 1 rises such that the voltage VB at the node between the resistors 151 and 152 becomes higher than a voltage obtained by subtracting the threshold voltage of the N-channel transistor 156 from the gate voltage VGN of the N-channel transistor 156, the N-channel transistor 156 becomes the OFF state. The audio input signal VI of the input terminal 1 when the N-channel transistor 156 is switched from the ON state to the OFF state becomes the bending-point input voltage −VIZ.

In a range in which the voltage value of the audio input signal VI is negative and is the negative bending-point input voltage −VIZ or more, the voltage VB at the node between the resistors 151 and 152 corresponds to the voltage V23 at the node between the resistors 12 and 13. Therefore, the signal at the node between the resistors 11 and 12 is not attenuated by the attenuator 185, and thus the gain of the amplifying unit 10 becomes the maximum gain G0 (=R4/(R1+R2+R3)).

Figure 4A:
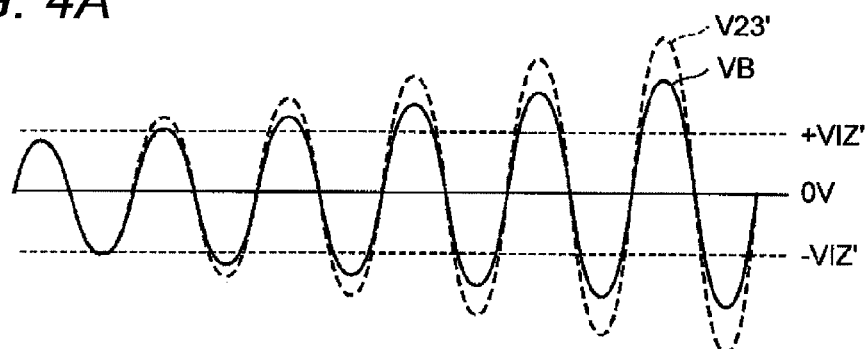
FIGS. 4A to 4C are views illustrating signal waveforms of individual portions of the power amplifier according to the first embodiment.
Figure 4B:
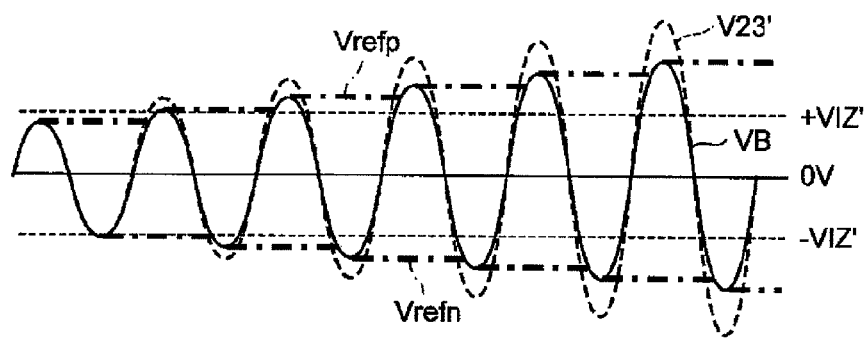
Figure 4C:
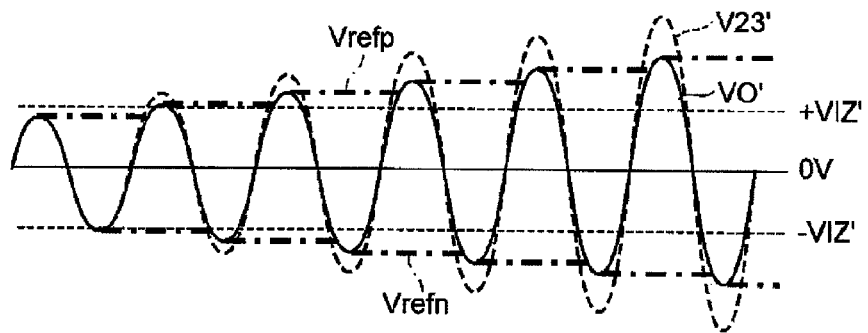

FIGS. 4A to 4C are views illustrating signal waveforms of individual portions of the power amplifier according to the first embodiment. FIG. 4A shows the waveform voltage V23' of the voltage V23 at the node between the resistors 12 and 13 and the waveform of the voltage VB at the node between the resistors 151 and 152 in a case where attenuation by the attenuator 185 is not performed when the amplitude of the audio input signal VI increases gradually. FIG. 4B shows the waveform V23' of the voltage V23 at the node between the resistors 12 and 13, the waveform of the voltage VB at the node between the resistors 151 and 152, and the waveforms of the reference voltages Vrefp and Vrefn in the same case as that shown in FIG. 4A. FIG. 4C shows the waveform V23' of the voltage V23 at the node between the resistors 12 and 13, the waveforms of the reference voltages Vrefp and Vrefn, a waveform VO'(=VO×R3/R4) obtained by converting the voltage value of the audio output signal VO obtained from the amplifying unit 10 into the voltage value at the node between the resistors 12 and 13 in the same case as that shown in FIG. 4A. In FIGS. 4A to 4C, reference symbols +VIZ' and −VIZ' represent the voltage at the node between the resistors 12 and 13 when the voltage value of the audio input signal VI is the bending-point input voltages +VIZ and −VIZ, respectively.

In a case where the amplitude of the audio input signal VI is small and the waveform V23' of the voltage V23 is within a range between the voltages +VIZ' and −VIZ' (a case where the amplitude of the audio input signal VI is with in the range between the bending-point input voltages +VIZ and −VIZ), the P-channel transistor 155 and the N-channel transistor 156 become the OFF state, such that the waveform of the voltage VB corresponds to the waveform V23' of the voltage V23.

If the amplitude of the audio input signal VI increases, and the voltage V23 exceeds the voltage +VIZ' (the amplitude of the audio input signal VI exceeds the bending-point input voltage +VIZ), in a range in which the voltage V23 exceeds the voltage +VIZ', since the P-channel transistor 155 becomes the ON state, the voltage VB becomes lower than the voltage V23. If the voltage V23 is below the voltage −VIZ' (the amplitude of the audio input signal VI is below the bending-point input voltage −VIZ), in a range in which the voltage V23 is below the voltage −VIZ', since the N-channel transistor 156 becomes the ON state, the voltage VB becomes higher than the voltage V23 (see FIG. 4A). In this case, the dependence of the voltage VB on the voltage value of the audio input signal VI is as described with reference to FIG. 3.

Therefore, as shown in FIG. 4B, the reference voltage Vrefp rises according to the positive peak of the voltage VB, and then maintains the peak value, and the reference voltage Vrefn rises according to the negative peak of the voltage VB and then maintains the peak value.

In a case where the amplitude of the audio input signal VI is small and the voltage V23 is within the range between the reference voltages Vrefp and Vrefn, the signal at the node between the resistors 11 and 12 is not attenuated by the attenuator 185. Therefore, in the amplifying unit 10, the audio input signal VI is amplified with the maximum gain G0 (=R4/(R1+R2+R3)), so as to obtain the audio output signal VO. In a region where the amplitude of the audio input signal VI is large, and the voltage V23 exceeds the range between the reference voltages Vrefp and Vrefn, the signal at the node between the resistors 11 and 12 is attenuated by the attenuator 185. Therefore, the audio input signal VI is amplified with a gain smaller than the maximum gain (R4/(R1+R2+R3)) in the amplifying unit 10.

As described with reference to FIG. 3, when the amplitude of the audio input signal VI is the input-stage maximum voltages VIMAX and −VIMAX, the gain of the amplifying unit 10 is adjusted such that the amplitude of the audio output signal VO becomes the output limit voltages −VOLMT and +VOLMT. Therefore, as long as the amplitude of the audio input signal VI is within the range between the input-stage maximum voltages VIMAX and −VIMAX, the audio output signal VO without waveform distortion is obtained from the audio input signal VI (see the waveform VO' in FIG. 4C)

As described above, according to the first embodiment, in a case where the input-stage maximum voltage +VIMAX is designated, when the amplitude of the audio input signal VI becomes the input-stage maximum voltage +VIMAX, it is possible to automatically implement an optimal dynamic range compression characteristic (see FIGS. 2A and 2B) such that the amplitude of the audio output signal VO becomes the output limit voltages VOLMT. Therefore, it is possible to make the most of the amplitude range of the audio output signal VO which the amplifying unit 10 can output, and to amplify the audio input signal VI in the amplifying unit 10 without occurrence of distortion in an output waveform.

Second Embodiment

Figure 5:
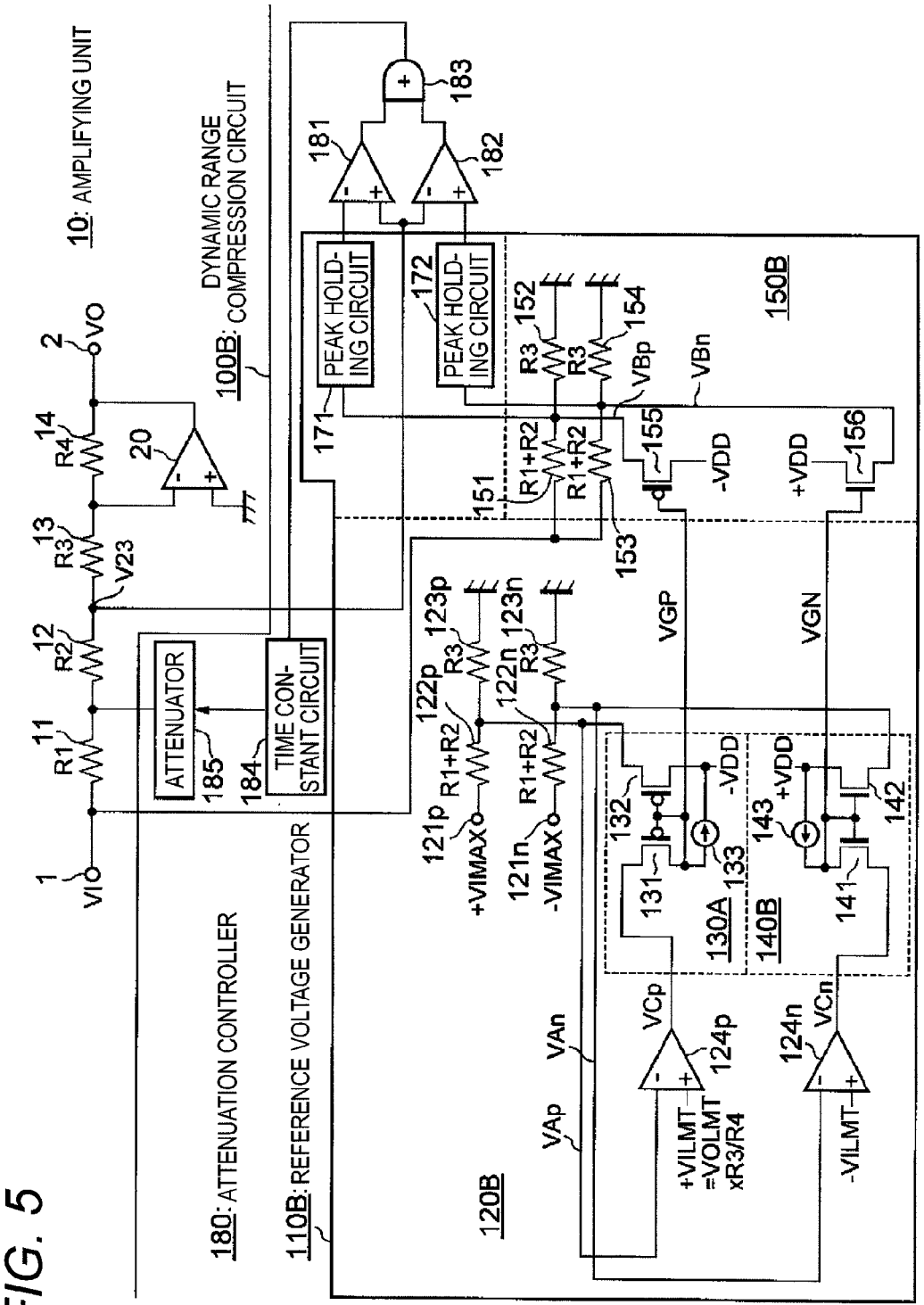
FIG. 5 is a circuit diagram illustrating a configuration of a power amplifier including a dynamic range compression circuit according to a second embodiment of the present invention.

FIG. 5 is a circuit diagram illustrating a configuration of a power amplifier including a dynamic range compression circuit 100B according to a second embodiment of the present invention. In the second embodiment shown in FIG. 5 and the first embodiment (FIG. 1), common portions are denoted by the same reference symbols. In the dynamic range compression circuit 100B according to the second embodiment, a reference voltage generator 110B takes the place of the reference voltage generator 110A of the first embodiment (FIG. 1). The reference voltage generator 110B includes a first voltage-dependent voltage-dividing circuit 120B and a second voltage-dependent voltage-dividing circuit 150B. Further, in the first embodiment, the common voltage VB is supplied to the peak holding circuits 171 and 172, whereas in the second embodiment, separate voltages VBp and VBn are supplied from the reference voltage generator 110B to the peak holding circuits 171 and 172, respectively.

The first voltage-dependent voltage-dividing circuit 120B additionally includes a voltage input terminal 121n to which the negative input maximum voltage −VIMAX is applied, and a resistor 122n having a resistance value of (R1+R2) and a resistor 123n having a resistance value R3 interposed in series between the voltage input terminal 121n and the ground line. A configuration of a circuit composed of the differential amplifier 124p, the voltage-dependent resistor 130A, and the resistors 122p and 123p is the same as that of the first voltage-dependent voltage-dividing circuit 120A of the first embodiment. The second embodiment is different from the first embodiment in that the second embodiment does not have the polarity reversing circuit 128, and additionally includes a differential amplifier 124n and a voltage-dependent resistor 140B taking the place of the voltage-dependent resistor 140A of the first embodiment.

The differential amplifier 124n is a circuit which compares a voltage VAn at a node between the resistors 122n and 123n with the negative input limit voltage −VILMT, and changes the output signal VCn in the positive direction in a case where the voltage VAn is lower than the negative input limit voltage −VILMT, and changes the output signal VCn in the negative direction in a case where the voltage VAn is higher than the negative input limit voltage −VILMT. Between an output terminal of the differential amplifier 124n and the node between the resistors 122n and 123n, the voltage-dependent resistor 140B is interposed. The voltage-dependent resistor 140B has a configuration obtained by adding an N-channel transistor 142 to the voltage-dependent resistor 140A of the first embodiment. The N-channel transistor 142 has a gate connected to the gate and drain of the N-channel transistor 141, a drain connected to the power source +VDD, and a source connected to the node between the resistors 122n and 123n.

In this configuration, a voltage VGN of a connection node of the gate and drain of the N-channel transistor 141 and the gate of the N-channel transistor 142 becomes a voltage higher than an output voltage VCn of the differential amplifier 124n by the threshold voltage of the N-channel transistor 141.

Here, if the voltage VAn at the node between the resistors 122n and 123n becomes lower than the input limit voltage −VILMT such that the output voltage VCn of the differential amplifier 124n changes in the positive direction, the gate voltage VGN of the N-channel transistors 141 and 142 also changes in the positive direction. As a result, the ON resistance of the N-channel transistor 142 decreases, and thus the voltage VAn at the node between the resistors 122n and 123n rises.

Meanwhile, if the voltage VAn at the node between the resistors 122n and 123n becomes higher than the input limit voltage −VILMT such that the output voltage VCn of the differential amplifier 124n changes in the negative direction, the gate voltage VGN of the N-channel transistors 141 and 142 also changes in the negative direction. As a result, the ON resistance of the N-channel transistor 142 increases, and thus the voltage VAn at the node between the resistors 122n and 123n decreases. As a result of the action of this negative feedback, the voltage VAn at the node between the resistors 122n and 123n corresponds to the input limit voltage −VILMT.

The second voltage-dependent voltage-dividing circuit 150B additionally includes a resistor 153 having a resistance value of (R1+R2) and a resistor 154 having a resistance value R3 interposed between the input terminal 1 and the ground line, as compared to the second voltage-dependent voltage-dividing circuit 150A of the first embodiment (FIG. 1). Further, the P-channel transistor 155 has a gate which receives the gate voltage VGP from the voltage-dependent resistor 130A, a drain connected to the power source −VDD, and a source connected to the node between the resistors 151 and 152. Furthermore, the N-channel transistor 156 has a gate which receives the gate voltage VGN from the voltage-dependent resistor 140B, a drain connected to the power source +VDD, and a source connected to a node between the resistors 153 and 154. Here, the N-channel transistor 156 and the N-channel transistor 142 of the voltage-dependent resistor 140B have the same transistor size, and thus when the same source voltage is applied to the N-channel transistor 156 and the N-channel transistor 142, the N-channel transistor 156 and the N-channel transistor 142 have the same ON resistance. In the second voltage-dependent voltage-dividing circuit 150B, the voltage VBp at the node between the resistors 151 and 152 is supplied to the peak holding circuit 171, and a voltage VBn at the node between the resistors 153 and 154 is supplied to the peak holding circuit 172.

In the second embodiment, the gate voltage VGP for the P-channel transistor 132 is adjusted such that the voltage VAp at the node between the input resistors 122p and 123p, which is a result of voltage division on the positive input-stage maximum voltage +VIMAX, becomes the input limit voltage VILMT, and the adjusted gate voltage VGP is applied to the gate of the P-channel transistor 155. Further, the gate voltage VGN for the N-channel transistor 212 is adjusted such that the voltage VAn at the node between the input resistors 122n and 123n, which is a result of voltage division on the negative input-stage maximum voltage −VIMAX, becomes the input limit voltage −VILMT, and the adjusted gate voltage VGN is applied to the gate of the N-channel transistor 156.

Here, in a case where the voltage value of the audio input signal VI to the input terminal 1 is the input maximum voltage +VIMAX, the voltage VBp at the node between the resistors 151 and 152 becomes the input limit voltage VILMT. Meanwhile, in a case where the voltage value of the audio input signal VI to the input terminal 1 is the input maximum voltage −VIMAX, the voltage VBn at the node between the resistors 153 and 154 becomes the input limit voltage −VILMT. Therefore, in the cases where the amplitude of the audio input signal VI to the input terminal 1 is the input maximum voltages ±VIMAX, the reference voltage Vrefp output by the peak holding circuit 171 becomes the input limit voltage +VILMT, and the reference voltage Vrefn output by the peak holding circuit 172 becomes the input limit voltage −VILMT. Then, if the voltage V23 between the resistors 12 and 13 exceeds the range between the reference voltages Vrefp (=+VILMT) and Vrefn (=−VILMT), signal attenuation is performed by the attenuator 185. As a result, the amplitude of the audio output signal VO output by the amplifying unit 10 becomes the output limit voltages ±VOLMT.

If the voltage value of the audio input signal VI to the input terminal 1 decreases from the input-stage maximum voltage +VIMAX, according to this decrease, the voltage VBp at the node between the resistors 151 and 152 decreases, the ON resistance of the P-channel transistor 155 increases, and a voltage division ratio for generating the voltage VBp increases toward {R3/(R1+R2+R3)}. Meanwhile, if the voltage value of the audio input signal VI to the input terminal 1 increases from the input-stage maximum voltage −VIMAX, according to this increase, the voltage VBn at the node between the resistors 153 and 154 increases, the ON resistance of the N-channel transistor 156 increases, and a voltage division ratio for generating the voltage VBn increases toward {R3/(R1+R2+R3)}.

Therefore, if the amplitude of the audio input signal VI decreases from the input maximum voltages ±VIMAX, according to this decrease, a ratio of the absolute value of each of the reference voltages Vrefp and Vrefn to the amplitude of the audio input signal VI increases, and thus the gain of the amplifying unit 10 gradually increases.

Then, if the amplitude of the audio input signal VI decreases so as to become the bending-point input voltage or less, the P-channel transistor 155 and the N-channel transistor 156 become the OFF state, and thereafter, the gain of the amplifying unit 10 becomes a constant value {R4/(R1+R2+R3)}.

As described above, in the second embodiment, the same effects as the first embodiment are obtained.

Third Embodiment

Figure 6:
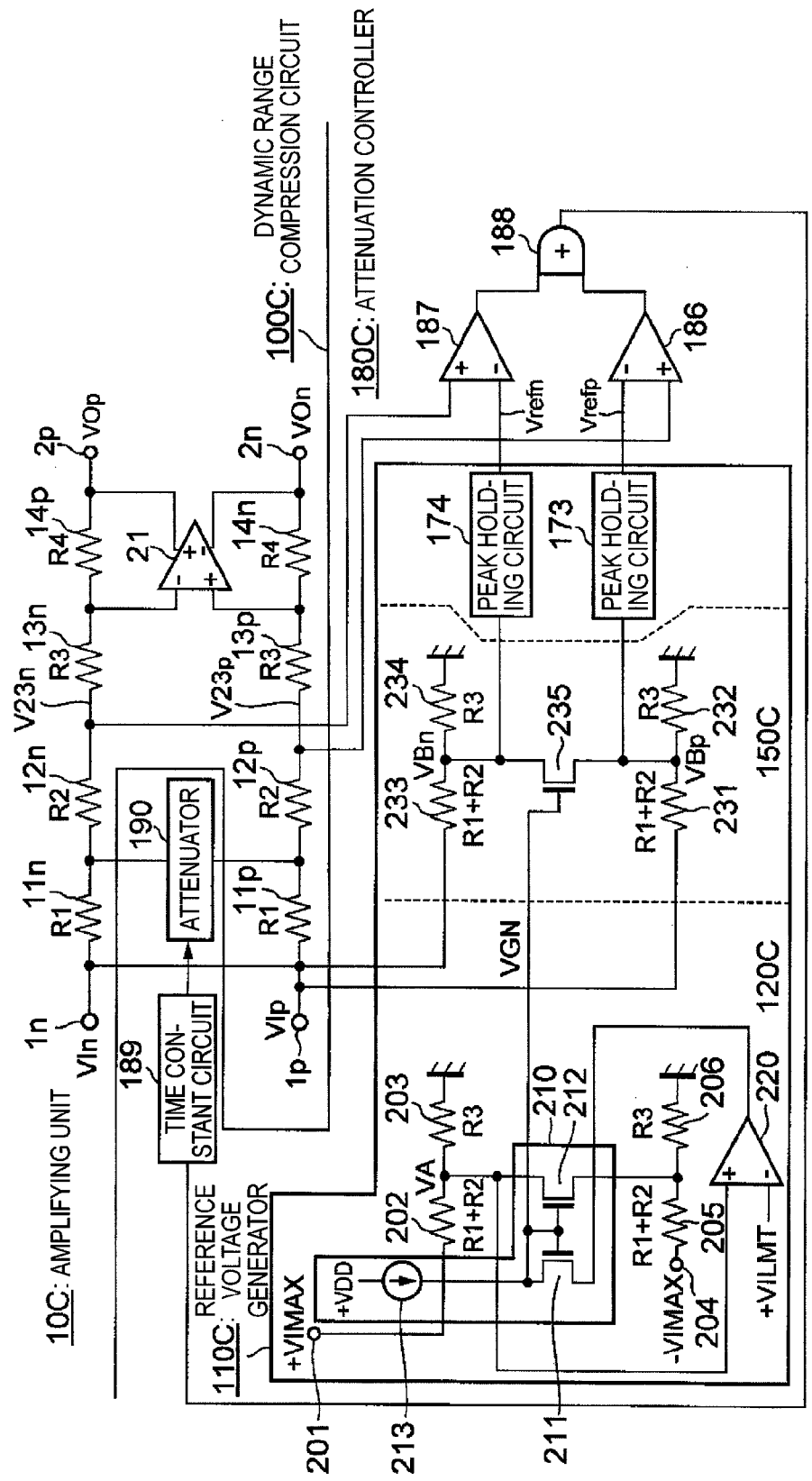
FIG. 6 is a circuit diagram illustrating a configuration of a power amplifier including a dynamic range compression circuit according to a third embodiment of the present invention.

FIG. 6 is a circuit diagram illustrating a configuration of a power amplifier including a dynamic range compression circuit 100C according to a third embodiment of the present invention. The dynamic range compression circuits of the first and second embodiments have been applied to the single-end-type amplifying unit 10. In contrast, the dynamic range compression circuit 100C according to the third embodiment is applied to an amplifying unit 100. The amplifying unit 100 is a differential amplification type amplifier circuit which differentially amplifies two audio input signals VIp and VIn having a normal phase and a reverse phase input to an input terminals 1p and 1n, and outputs two audio output signals VOp and VOn having a normal phase and a reverse phase, which are the differential amplification results, from output terminals 2p and 2n.

In the amplifying unit 100, between the input terminal 1p and the output terminal 2n, a resistor 11p having a resistance value R1, a resistor 12p having a resistance value R2, a resistor 13p having a resistance value R3, and a resistor 14n having a resistance value R4 are interposed in series. Further, between the input terminal 1n and the output terminal 2p, a resistor 11n having a resistance value R1, a resistor 12n having a resistance value R2, a resistor 13n having a resistance value R3, and a resistor 14p having a resistance value R4 are interposed in series. A differential amplifier 21 has a normal-phase input terminal connected to a node between the resistors 13p and 14n, a reverse-phase input terminal connected to a node between the resistors 13n and 14p, a normal-phase output terminal connected to the output terminal 2p, and a reverse-phase output terminal connected to the output terminal 2n. The differential amplifier 21 make the normal-phase input terminal and the reverse-phase input terminal a virtually grounded state, and differentially amplifies the normal-phase audio input signal VIp input through the resistors 11p, 12p, and 13p, and the reverse-phase audio input signal VIn input through the resistors 11n, 12n, and 13n.

The dynamic range compression circuit 1000 includes a reference voltage generator 110C and an attenuation controller 180C. The dynamic range compression circuit 100C also implements the examples of the dynamic range compression characteristic shown in FIGS. 2A and 2B, like the first and second embodiments. The reference voltage generator 110C is a circuit which generates the reference voltages Vrefp and Vrefn for implementing the dynamic range compression characteristic appropriate for a desired input-stage maximum voltage VIMAX, from the audio input signals VIp and VIn. The attenuation controller 180C is a circuit which has the same function as that of the attenuation controller 180 of the first embodiment, and includes comparators 186 and 187, an OR gate 188, a time constant circuit 189, and an attenuator 190.

The comparator 186 is a circuit which outputs a low level when a voltage V23p at the node between the resistors 12p and 13p of the amplifying unit 10 is lower than the reference voltage Vrefp, and outputs a high level when the voltage V23p is higher than the reference voltage Vrefp. The comparator 187 is a circuit which outputs a low level when a voltage V23n at the node between the resistors 12n and 13n is lower than the reference voltage Vrefn, and outputs a high level when the voltage V23n is higher than the reference voltage Vrefn. The OR gate 188 outputs a low level when output signals of both of the comparators 186 and 187 are at a low level, and outputs a high level when at least one of the output signals is at a high level.

The time constant circuit 189 is a circuit which raises an output signal over a predetermined attack time when an output signal of the OR gate 188 rises, and lowers the output signal over a predetermined release time when the output signal of the OR gate 188 falls. The attenuator 190 is composed of, for example, a field-effect transistor, and is interposed between the node between the resistors 11p and 12p, and the node between the resistors 11n and 12n. The attenuator 190 has ON resistance which decreases as a voltage of an output signal of the time constant circuit 189 increases, and attenuates a signal at the node between the resistors 11p and 12p and a signal at the node between the resistors 11n and 12n so as to reduce the gain of the amplifying unit 100.

Next, the reference voltage generator 110C will be described. The reference voltage generator 110C includes a first voltage-dependent voltage-dividing circuit 120C, a second voltage-dependent voltage-dividing circuit 150C, and peak holding circuits 173 and 174.

The first voltage-dependent voltage-dividing circuit 120C includes a resistor 202 having a resistance value of (R1+R2) and a resistor 203 having a resistance value R3 interposed in series between a voltage input terminal 201 and a ground line. Here, the positive input-stage maximum voltage +VIMAX is applied to the voltage input terminal 201. Further, the first voltage-dependent voltage-dividing circuit 120C includes a resistor 205 having a resistance value of (R1+R2) and a resistor 206 having a resistance value R3 interposed in series between a voltage input terminal 204 and the ground line. Here, the negative input-stage maximum voltage −VIMAX is applied to the voltage input terminal 204. Between a node between the resistors 202 and 203 and a node between the resistors 205 and 206, a voltage-dependent resistor 210 is interposed. Further, a differential amplifier 220 controls the resistance of the voltage-dependent resistor 210 such that a voltage VA at the node between the resistors 202 and 203 becomes the input limit voltage +VILMT.

More specifically, the voltage-dependent resistor 210 includes N-channel transistors 211 and 212, and a constant current source 213. Here, the N-channel transistor 212 has a drain and a gate connected to a gate of the N-channel transistor 212, and connected to the power source +VDD through the constant current source 213. Further, the N-channel transistor 211 has a source connected to an output terminal of the differential amplifier 220. Therefore, the gate voltage VGN of the N-channel transistors 211 and 212 becomes a voltage value higher than an output voltage of the differential amplifier 220 by a threshold voltage of the N-channel transistor 211. The N-channel transistor 212 has a drain connected to the node between the resistors 202 and 203, and a source connected to the node between the resistors 205 and 206.

The differential amplifier 220 compares the voltage VA at the node between the resistors 202 and 203 with the input limit voltage +VILMT, and raises an output signal to be applied to the N-channel transistor 211 when the voltage VA is higher than the input limit voltage +VILMT. As a result, the gate voltage VGN of the N-channel transistors 211 and 212 rises, the ON resistance of the N-channel transistor 212 decreases, and the voltage VA at the node between the resistors 202 and 203 decreases. Meanwhile, in a case where the voltage VA is lower than the input limit voltage +VILMT, the differential amplifier 220 lowers the output signal to be applied to the source of the N-channel transistor 211. As a result, the gate voltage VGP of the N-channel transistors 211 and 212 decreases, the ON resistance of the N-channel transistor 212 increases, and the voltage VA at the node between the resistors 202 and 203 increases. As a result of the action of this negative feedback control, the voltage VA at the node between the resistors 202 and 203 corresponds to the input limit voltage +VILMT.

The second voltage-dependent voltage-dividing circuit 150C includes resistors 231 and 233 having resistance values of (R1+R2), resistors 232 and 234 having resistance values R3, and an N-channel transistor 235. Here, the resistors 231 and 232 are interposed in series between the input terminal 1p and the ground line, and the resistors 233 and 234 are interposed in series between the input terminal 1n and the ground line. The N-channel transistor 235 has a drain connected to a node between the resistors 231 and 232, and a source connected to a node between the resistors 233 and 234. Further, the N-channel transistor 235 has a gate which receives the same gate voltage VGN as that applied to the gate of the N-channel transistor 212.

Whenever a positive peak occurs in a voltage at the node between the resistors 231 and 232, the peak holding circuit 173 makes the reference voltage Vrefp follow the corresponding peck voltage. Whenever a positive peak occurs in a voltage at the node between the resistors 233 and 234, the peak holding circuit 174 makes the reference voltage Vrefn follow the corresponding peck voltage.

In the third embodiment, the gate voltage VGN for the N-channel transistor 212 is adjusted such that the voltage VA at the node between the input resistors 202 and 203, which is a result of voltage division on the positive input-stage maximum voltage +VIMAX, becomes the input limit voltage +VILMT, and the adjusted gate voltage VGN is applied to the gate of the N-channel transistor 235.

Here, in a case where the voltage value of the audio input signal VIp to the input terminal 1p is the input-stage maximum voltage +VIMAX, and the voltage value of the audio input signal VIn to the input terminal in is the input-stage maximum voltage −VIMAX, the ON resistance of the N-channel transistor 235 becomes the same as the ON resistance of the N-channel transistor 212. Therefore, the voltage VBp at the node between the resistors 231 and 232 becomes the input limit voltage +VILMT. Meanwhile, even in a case where the voltage value of the audio input signal VIp to the input terminal 1p is the input-stage maximum voltage −VIMAX, and the voltage value of the audio input signal VIn to the input terminal 1n is the input-stage maximum voltage +VIMAX, the ON resistance of the N-channel transistor 235 becomes the same as the ON resistance of the N-channel transistor 212. In this case, the voltage VBn at the node between the resistors 233 and 234 becomes the input limit voltage +VILMT. Therefore, in a case where the amplitudes of the audio input signals VIp and VIn are the input-stage maximum voltage ±VIMAX, the reference voltage Vrefp output by the peak holding circuit 173 becomes the input limit voltage +VILMT, and the reference voltage Vrefn output by the peak holding circuit 174 also becomes the input limit voltage +VILMT. In a case where the voltage V23p at the node between the resistors 12p and 13p exceeds the reference voltage Vrefp (=+VILMT) or the voltage V23n at the node between the resistors 12n and 13n exceeds the reference voltage Vrefn (=+VILMT), signal attenuation is performed by the attenuator 190. Therefore, in a case where the amplitudes of the audio input signals VIp and VIn are the input-stage maximum voltage ±VIMAX, the amplitudes of the audio output signals VOp and VOn which the amplifying unit 10C outputs become the output limit voltages ±VOLMT.

If the voltage value of the audio input signal VIp decreases from the input-stage maximum voltage +VIMAX, according to this decrease, the voltage VBp at the node between the resistors 231 and 232 decreases, the ON resistance of the N-channel transistor 235 increases, and a voltage division ratio for generating the voltage VBp increases toward {R3/(R1+R2+R3)}. Meanwhile, if the voltage value of the audio input signal VIn decreases from the input-stage maximum voltage +VIMAX, according to this decrease, the voltage VBn at the node between the resistors 233 and 234 decreases, the ON resistance of the N-channel transistor 235 increases, and the voltage division ratio for generating the voltage VBn increases toward {R3/(R1+R2+R3)}.

Therefore, the amplitudes of the audio input signals VIp and VIn decrease from the input-stage maximum voltage ±VIMAX, according to this decrease, the ratios of the reference voltages Vrefp and Vrefn to the amplitudes of the audio input signals VIp and VIn become large, such that the gain of the amplifying unit 10C gradually increases so as to approach to the maximum gain G0 (=R4/(R1+R2+R3)).

Then, if the amplitudes of the audio input signals VIp and VIn decrease, and a difference between the gate voltage VGN of the N-channel transistor 235 and the lower voltage of the voltage VBp at the node between the resistors 231 and 232 and the voltage VBn at the node between the resistors 233 and 234 becomes lower than the threshold voltage of the N-channel transistor 235, the N-channel transistor 235 becomes the OFF state. In this case, the amplitudes of the audio input signals VIp and VIn becomes the bending-point input voltage VIZ. Therefore, in a range in which the amplitudes of the audio input signals VIp and VIn are smaller than the bending-point input voltage VIZ, the gain of the amplifying unit 10 becomes the maximum gain G0 (=R4/(R1+R2+R3)).

As described above, according to the third embodiment, it is possible to implement dynamic range compression characteristic by making the most of the amplitude range between the output limit voltages ±VOLMT which the amplifying unit 10C can output, and reflecting changes of the amplitudes of the input signals VIp and VIn in the range between the input-stage maximum voltages ±VIMAX, in a changes in amplitudes of the output signals VOp and VOn.

Fourth Embodiment

Figure 7:
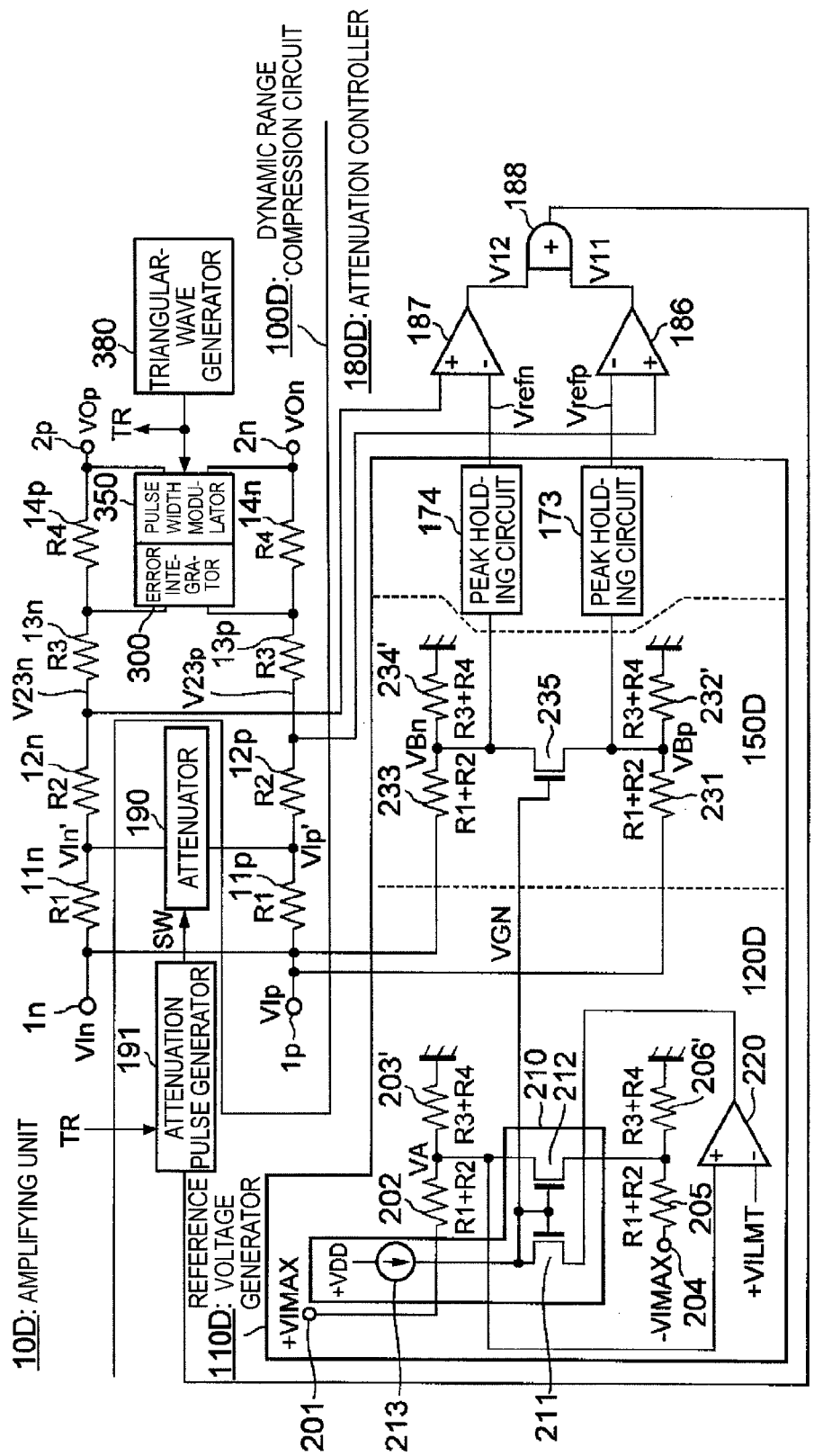
FIG. 7 is a circuit diagram illustrating a configuration of a power amplifier including a dynamic range compression circuit according to a fourth embodiment of the present invention.

FIG. 7 is a circuit diagram illustrating a configuration of a power amplifier including a dynamic range compression circuit 100D according to a fourth embodiment of the present invention. In the fourth embodiment shown in FIG. 7 and the third embodiment (FIG. 6), common portions are denoted by the same reference symbols. The dynamic range compression circuit 100D according to the fourth embodiment is applied to an amplifying unit 10D which is a differential amplification type class-D amplifier. The amplifying unit 10D is different from the amplifying unit of the third embodiment in that the amplifying unit 10D does not have the differential amplifier 21 and additionally includes an error integrator 300, a pulse width modulator 350, and a triangular-wave generator 380. In the dynamic range compression circuit 100D, an attenuation controller 180D takes the place of the attenuator 180C of the third embodiment. In the attenuation controller 180D, an attenuation pulse generator 191 (an attenuation signal generator) takes the place of the time constant circuit 189 of the attenuator 180C. A reference voltage generator 110D takes the place of the reference voltage generator 110C of the third embodiment. The reference voltage generator 110D includes a first voltage-dependent voltage-dividing circuit 120D and a second voltage-dependent voltage-dividing circuit 150D. Here, the first voltage-dependent voltage-dividing circuit 120D includes resistors 203' and 206' having resistance values of (R3+R4) take the place of the resistors 203 and 206 having the resistance value R3 in the first voltage-dependent voltage-dividing circuit 120C of the third embodiment. The second voltage-dependent voltage-dividing circuit 150D includes resistors 232' and 234' having resistance values of (R3+R4) taking the place of the resistors 232 and 234 having the resistance value R3 in the second voltage-dependent voltage-dividing circuit 150C of the third embodiment.

Figure 8:
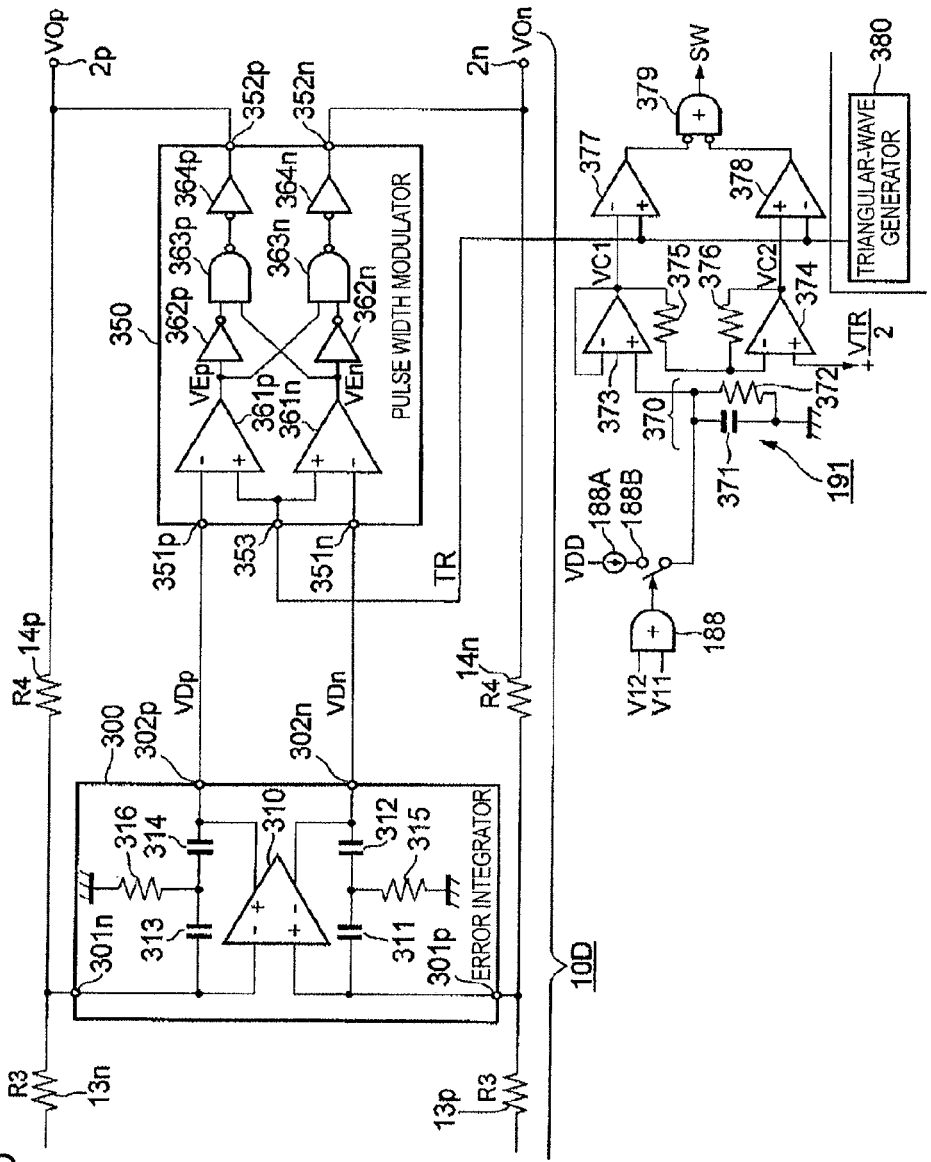
FIG. 8 is a circuit diagram illustrating a configuration of an error integrator, a pulse width modulator, a triangular-wave generator, and an attenuation pulse generator in an attenuation controller according to the fourth embodiment.

FIG. 8 is a circuit diagram illustrating a configuration of the error integrator 300, the pulse width modulator 350, and the triangular-wave generator 380 of the amplifying unit 10D, and the attenuation pulse generator 191 in the attenuation controller 180D.

The error integrator 300 has a normal-phase input terminal 301p which receives the normal-phase audio input signal VIp through the resistors 11p, 12p, and 13p, and a reverse-phase input terminal 301n which receives the reverse-phase audio input signal VIn through the resistors 11n, 12n, and 13n. Further, the reverse-phase audio output signal (digital signal) VOn is fed back to the normal-phase input terminal 301p of the error integrator 300 through the resistor 14n, and the normal-phase audio output signal VOp is fed back to the reverse-phase input terminal 301n of the error integrator 300 through the resistor 14p. Then, the error integrator 300 integrates errors of the applied audio input signals VIp and VIn and the audio output signals VOp and VOn, and outputs two signals VDp and VDn having a normal phase and a reverse phase, which represent the integration results, from a normal-phase output terminal 302p and a reverse-phase output terminal 302n, respectively.

Although various kinds of integrators can be considered as the error integrator 300, in an example shown in FIG. 8, a second-order error integrator 300 composed of a differential amplifier 310, four capacitors 311 to 314, and two resistors 315 and 316 is used. Here, a normal-phase input terminal and a reverse-phase input terminal of the differential amplifier 310 are composed of the normal-phase input terminal 301p and the reverse-phase input terminal 301n of the error integrator 300, respectively, and a normal-phase output terminal and a reverse-phase output terminal of the differential amplifier 310 are composed of the normal-phase output terminal 302p and the reverse-phase output terminal 302n of the error integrator 300, respectively. Between the normal-phase input terminal and the reverse-phase input terminal of the differential amplifier 310, the capacitors 311 and 312 for error integration are interposed in series, and a common connection node of the capacitors 311 and 312 is grounded through the resistor 315. Further, between the reverse-phase input terminal and the normal-phase input terminal of the differential amplifier 310, the capacitors 313 and 314 for error integration are interposed in series, and a common connection node of the capacitors 313 and 314 is grounded through the resistor 316.

The pulse width modulator 350 has a normal-phase input terminal 351p and a reverse-phase input terminal 351n connected to the normal-phase output terminal 302p and the reverse-phase output terminal 302n of the error integrator 300. The pulse width modulator 350 has a triangular-wave input terminal 353 which receives a triangular-wave signal TR from the triangular-wave generator 380. Further, the pulse width modulator 350 has a normal-phase output terminal 352p and a reverse-phase output terminal 352n composed of the output terminals 2p and 2n of the amplifying unit 10D. The pulse width modulator 350 uses the triangular-wave signal TR input to the triangular-wave input terminal 353 to generate two digital signals having a normal phase and a reverse phase and pulse widths according to the levels of output signals VDp and VDn of the error integrator 300, and outputs the digital signals as the audio output signals VOp and VOn from the normal-phase output terminal 352p and the reverse-phase output terminal 352n, respectively.

Although the pulse width modulator 350 may have various configurations, in the example shown in FIG. 8, the pulse width modulator 350 includes comparators 361p and 361n, inverters 362p and 362n, NAND gates 363p and 363n, and inverters 364p and 364n. The comparator 361p has a normal-phase input terminal which receives the triangular-wave signal TR, and a reverse-phase input terminal which receives the normal-phase output signal VDp of the error integrator 300, and the comparator 361n has a normal-phase input terminal which receives the triangular-wave signal TR, and a reverse-phase input terminal which receives the reverse-phase output signal VDn of the error integrator 300. The inverter 362p inverts a level of an output signal VEp of the comparator 361p and outputs the inverted signal as an output signal, and the inverter 362n inverts a level of an output signal VEn of the comparator 361n and outputs the inverted signal as an output signal. The NAND gate 363p receives the output signal VEn of the comparator 361n and the output signal of the inverter 362p, and the NAND gate 363n receives the output signal VEp of the comparator 361p and the output signal of the inverter 362n. The inverter 364p inverts a level of an output signal of the NAND gate 363p and outputs the inverted signal as the signal VOp from the normal-phase output terminal 352p, and the inverter 364n inverts a level of an output signal of the NAND gate 363n and outputs the inverted signal as the signal Von from the reverse-phase output terminal 352n.

Next, the attenuation pulse generator 191 will be described. The OR gate 188 outputs a logical sum of output signals V11 and V12 of the comparators 186 and 187 in FIG. 7. A capacitor 371 and a resistor 372 constitute an integrator 370. Between the integrator 370 and the power source VDD, a constant current source 188A and a switch 188B are interposed in series. The switch 188B is in an ON state when the output signal of the OR gate 188 is at the high level, and is in an OFF state when the output signal of the OR gate 188 is at the low level. Therefore, during a period when the output signal of the OR gate 188 is at the high level, the integrator 370 integrates a current supplied from the constant current source 188A, and during a period when the output signal of the OR gate 188 is at the low level, the integrator 370 attenuates the integrated value in accordance with a time constant determined by the capacitance value of the capacitor 371 and the resistance value of the resistor 372. A differential amplifier 373 has an output terminal and a reverse-phase input terminal short-circuited to each other, and constitutes a voltage follower buffer which transmits an output voltage of the integrator 370 as a first voltage VC1 for comparison to the next stage. The first voltage VC1 for comparison output from the voltage follower buffer is input to the reverse-phase input terminal of a differential amplifier 374 through a resistor 375. Between the reverse-phase input terminal and output terminal of the differential amplifier 374, a resistor 376 having the same resistance value as that of the resistor 375 is interposed, and a reference level+VTR/2 having the magnitude which is a half of an amplitude VTR of the triangular-wave signal TR is input to a normal-phase input terminal of the differential amplifier 374. Here, if an output voltage of the differential amplifier 374 is set to VC2, the following equation is established.

$$(VC1+VC2)/2=VTR/2 \qquad (4)$$

This equation is solved for VC2 as follows.

$$VC2=VTR-VC1 \qquad (5)$$

In other words, in a case where the first voltage VC1 for comparison is output from the differential amplifier 373, a circuit composed of the resistors 375 and 376 and the differential amplifier 374 acts as an inverting amplifier which outputs a second voltage VC2 for comparison lower than a voltage VTR by the first voltage VC1 for comparison.

A comparator 377 compares the first voltage VC1 for comparison and the triangular-wave signal TR, and outputs a high-level signal when the triangular-wave signal TR is higher than the first voltage VC1 for comparison, and outputs a low-level signal otherwise. A comparator 378 compares the second voltage VC2 for comparison and the triangular-wave signal TR, and outputs a high-level signal when the second voltage VC2 for comparison is higher than the triangular-wave signal TR, and outputs a low-level signal otherwise. A low-active OR gate 379 outputs an attenuation command pulse SW which is at a high level (active level) when at least one of output signals of the comparators 377 and 378 is at low level.

The fourth embodiment has the above-mentioned configuration.

Figure 9:
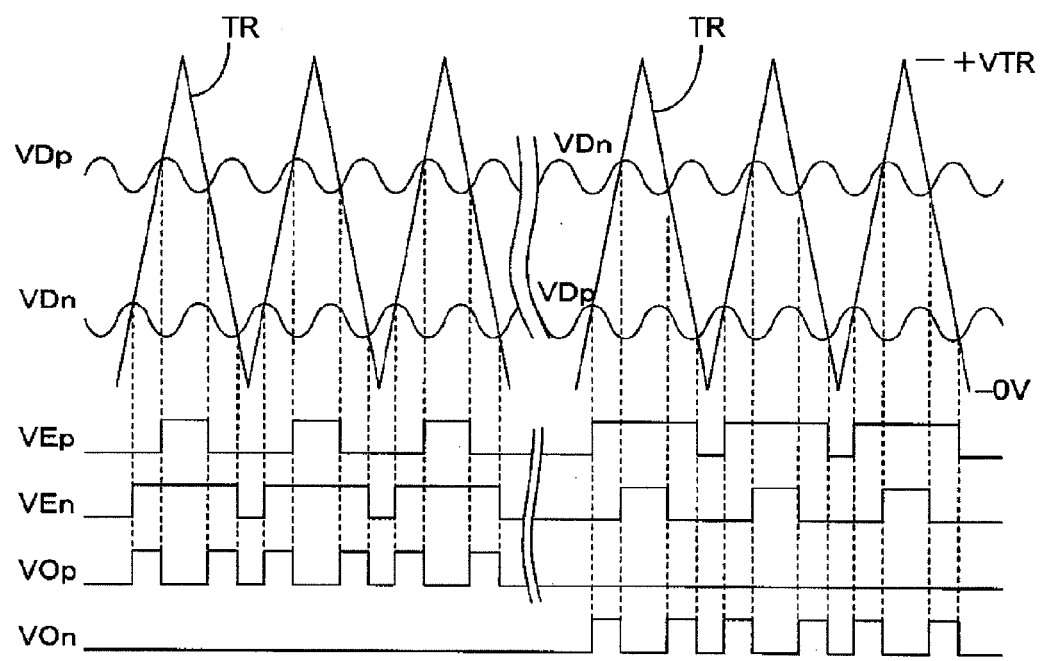
FIG. 9 is a waveform chart illustrating signal waveforms of individual portions of an amplifying unit according to the fourth embodiment.

Next, an operation of the fourth embodiment will be described. FIG. 9 is a waveform chart illustrating signal waveforms of individual portions of the amplifying unit 10D. Since the error integrator 300 integrates an error of the audio input signals VIp and VIn and the audio output signals VOp and VOn which are digital signals, the waveforms of the output signals VOp and VOn become waveforms obtained by superimposing ripples corresponding to the audio output signals on the waveforms of the input analog signals VIp and VIn. The pulse width modulator 350 compares the output signals VDp and VDn of the error integrator 300 with the triangular-wave signal TR. In a period when the output signal VDp is higher than the output signal VDn, for example, a period from when the level of the triangular-wave signal TR becomes higher than the level of the output signal VDn to when the level of the triangular-wave signal TR reaches the level of the output signal VDp and a period from when the level of the triangular-wave signal TR becomes lower than the level output signal VDp to when the level of the triangular-wave signal TR reaches the level of the output signal VDn, as shown on the left of FIG. 9, the digital signal VOp is at the high level, and the digital signal VOn is continuously at the low level. Also, in a period when the output signal VDn is higher than the output signal VDp, for example, a period from when the level of the triangular-wave signal TR becomes higher than the level of the output signal VDp to when the level of the triangular-wave signal TR reaches the level of the output signal VDn and a period from when the level of the triangular-wave signal TR becomes lower than the level output signal VDn to when the level of the triangular-wave signal TR reaches the level of the output signal VDp, as shown on the right of FIG. 9, the digital signal VOn is at the high level, and the digital signal VOp is continuously at the low level. In this way, the pulse width modulator 350 generates the audio output signals VOp and VOn having pulse widths proportional to a level difference between the two output signals VOp and VOn having phases of the error integrator 300.

As shown in FIG. 9, in a period when the amplifying unit 10D outputs the pulse-width modulated audio output signal VOp, the audio output signal VOn is 0 V. In this period, the voltage V23p at the node between the resistors 12p and 13p has a voltage value obtained by dividing the audio input signal VIp at a voltage division ratio of {(R3+R4)/(R1+R2+R3+R4)}. Further, in this period, the amplifying unit 10D makes the voltage at the node between the resistors 13n and 14p correspond to the voltage at the node between the resistors 13p and 14n (virtual short-circuiting), and performs an amplifying operation. In a period when the amplifying unit 10D outputs the pulse-width modulated audio output signal VOn, the audio output signal VOp is 0 V. In this period, the voltage V23n at the node between the resistors 12n and 13n has a voltage value obtained by dividing the audio input signal VIn at the voltage division ratio of {(R3+R4)/(R1+R2+R3+R4)}. Further, in this period, the amplifying unit 10D makes the voltage at the node between the resistors 13n and 14p correspond to the voltage at the node between the resistors 13p and 14n (virtual short-circuiting), and performs an amplifying operation. In the fourth embodiment, as described above, the resistance value of each of the resistors 203', 206', 232', and 234' of the reference voltage generator 110D is set to (R3+R4).

Figure 10A:
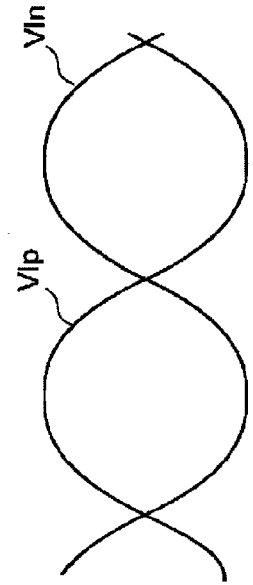
FIGS. 10A and 10B are waveform charts illustrating waveforms of individual portions of the attenuation controller according to the fourth embodiment.
Figure 10A:
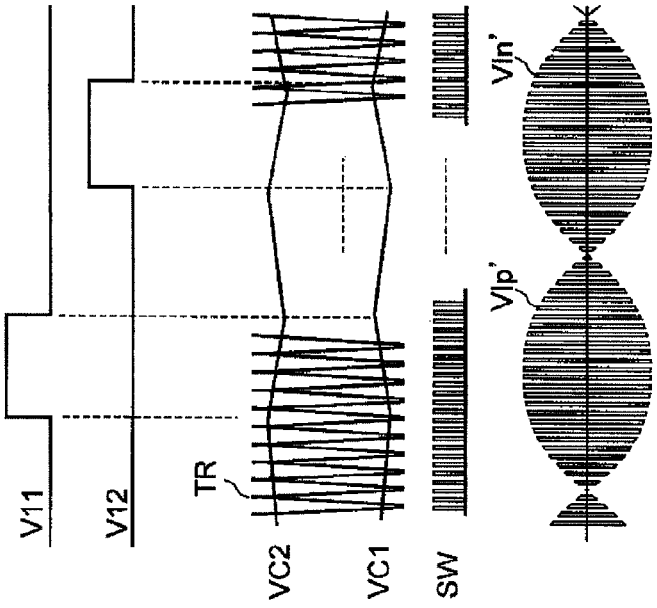

Next, an operation of the attenuation controller 180D will be described. FIG. 10A shows waveforms of individual portions of the attenuation controller 180D in a case where the voltage V23p at the node between the resistors 12p and 13p is the reference voltage Vrefp or less, the voltage V23n at the node between the resistors 12n and 13n is the reference voltage Vrefn or less, and the output voltages V11 and V12 of the comparators 186 and 187 are maintained at the low level. In this case, since the output signal of the OR gate 188 is continuously at the low level, the first voltage VC1 for comparison becomes 0 V and the second voltage VC2 for comparison becomes +VTR. Therefore, the triangular-wave signal TR does not intersect with the voltages VC1 and VC2 for comparison, the attenuation pulse SW is not generated, the attenuator 190 which is a switch is continuously in the OFF state, such that a waveform of an analog signal VIp' at the node between the resistors 11p and 12p and a waveform of an analog signal VIn' at the node between the resistors 11n and 12n become waveforms similar to the audio input signals VIp and VIn, as shown in FIG. 10A.

Figure 10B:
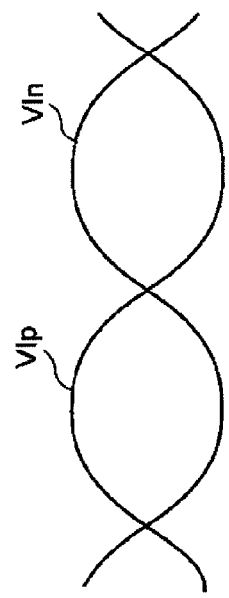
Figure 10B:
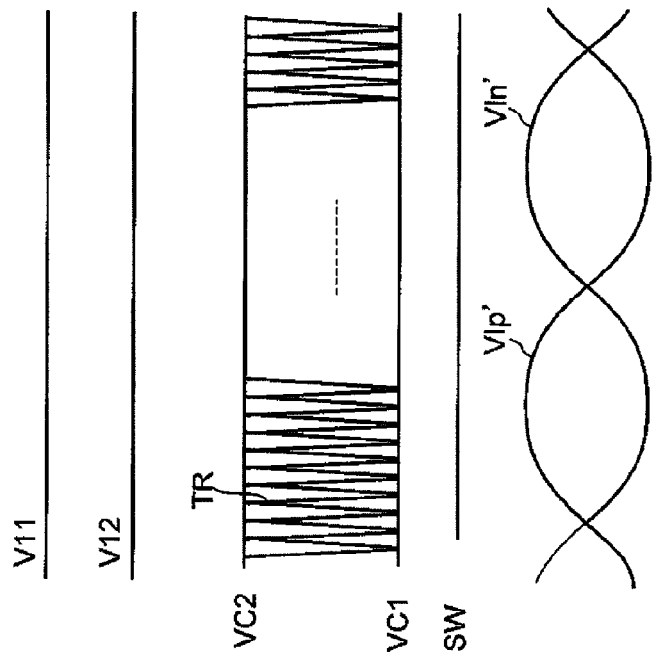

FIG. 10B shows waveforms of individual portions of the attenuation controller 180D in a case where the voltage V23p at the node between the resistors 12p and 13p is higher than the reference voltage Vrefp, the voltage V23n at the node between the resistors 12n and 13n is higher than the reference voltage Vrefn, and the output voltage V11 of the comparator 186 or the output voltage V12 of the comparator 187 is maintained at the high level. In this case, the first voltage VC1 for comparison repeats pulsation such that the first voltage VC1 for comparison increases when the signal V11 or V12 is at the high level, and decreases by discharge of accumulated charge of the capacitor 371 through the resistor 372 in a period from when the signal V11 or V12 becomes the low level to when the signal V11 or V12 becomes the high level again. According to this behavior of the first voltage VC1 for comparison, the second voltage VC2 (=+VTR−VC1) for comparison decreases from the voltage +VTR and repeats pulsation similar to that of the voltage VC1. Therefore, the triangular-wave signal TR intersects with the voltages VC1 and VC2 for comparison, and the attenuation pulse SW, which is at the high level (active level) in a period when the triangular-wave signal TR is lower than the voltage VC1 and a period when the triangular-wave signal TR is higher than the voltage VC2, is intermittently or periodically output from the low-active OR gate 379.

Here, the attenuator 190 is in the OFF state when the attenuation pulse SW is at the low level, and is in the ON state when the attenuation pulse SW is at the high level. Therefore, the analog signals VIp' and VIn' at both ends of the attenuator 190 have signal values corresponding to the original input analog signals VIp and VIn when the attenuation pulse SW is at the low level, and are 0 V when the attenuation pulse SW is at the high level, so as to have waveforms obtained by thinning at regular time intervals as shown in FIG. 10B. Therefore, an analog signal actually input to the error integrator 300 is attenuated, and the gain of the amplifying unit 10D decreases.

As described above, in the fourth embodiment, if the voltage V23p at the node between the resistors 12p and 13p exceeds the reference voltage Vrefp or the voltage V23n at the node between the resistors 12n and 13n exceeds the reference voltage Vrefn, the negative feedback control is performed to reduce the gain of the amplifying unit 10D, so as to automatically adjust the gain of the amplifying unit 10D such that the voltages V23p and V23n correspond to the reference voltages Vrefp and Vrefn. Therefore, even in the fourth embodiment, similarly to the third embodiment, it is possible to implement the dynamic range compression characteristic as shown in FIGS. 2A and 2B.

Fifth Embodiment

Figure 11:
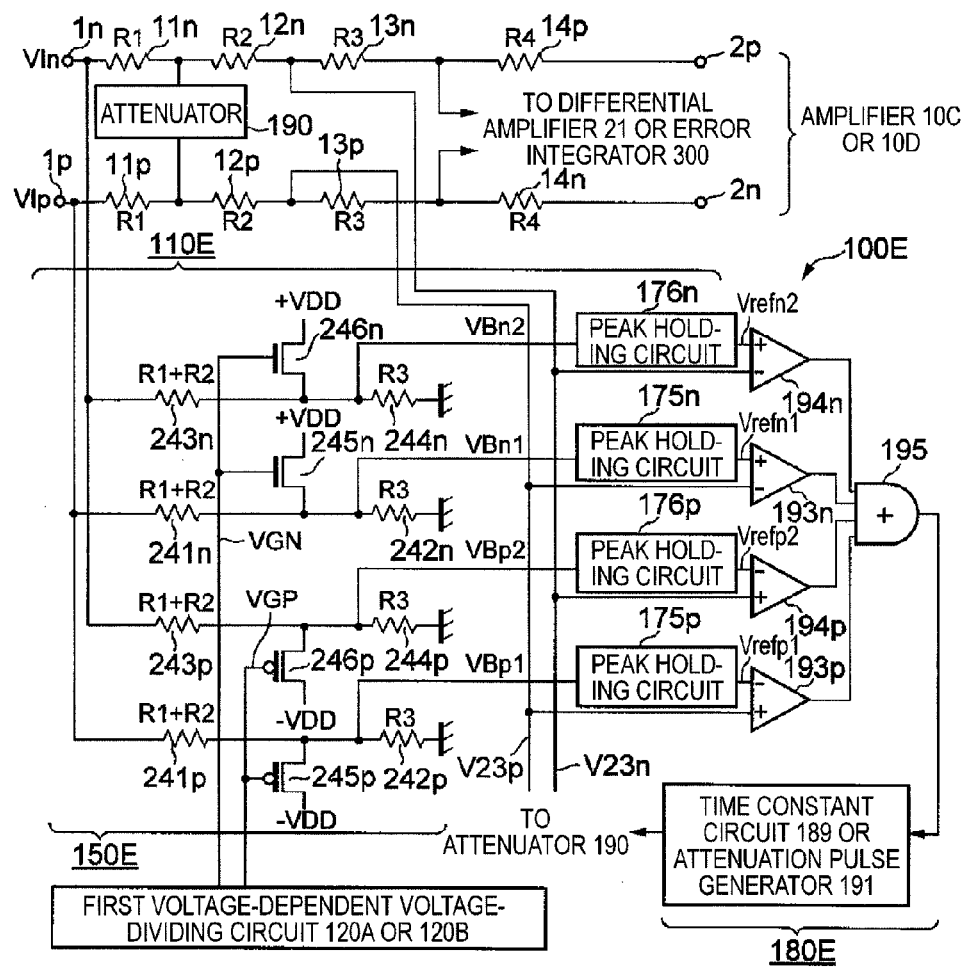
FIG. 11 is a circuit diagram illustrating a configuration of a power amplifier including a dynamic range compression circuit according to a fifth embodiment of the present invention.

FIG. 11 is a circuit diagram illustrating a configuration of a power amplifier including a dynamic range compression circuit 100E according to a fifth embodiment of the present invention. The dynamic range compression circuit 100E is applied to, for example, the amplifying unit 10C of the third embodiment or the amplifying unit 10D of the fourth embodiment. As shown in FIG. 11, the dynamic range compression circuit 100E according to the fifth embodiment includes a reference voltage generator 110E and an attenuation controller 180E.

The reference voltage generator 110E includes a first voltage-dependent voltage-dividing circuit having the same configuration as the first voltage-dependent voltage-dividing circuit 120A of the first embodiment or the first voltage-dependent voltage-dividing circuit 120B of the second embodiment, a second voltage-dependent voltage-dividing circuit 150E, and four peak holding circuits 175p, 176p, 175n, and 176n.

The second voltage-dependent voltage-dividing circuit 150E includes resistors 241p and 242p interposed in series between the input terminal 1p and the ground line, and resistors 241n and 242n interposed in series between the input terminal 1p and the ground line. Further, the second voltage-dependent voltage-dividing circuit 150E includes resistors 243p and 244p interposed in series between the input terminal 1n and the ground line, and resistors 243n and 244n interposed in series between the input terminal 1n and the ground line. Here, the resistors 241p, 243p, 241n, and 243n have a resistance value of (R1+R2). In a case of applying the dynamic range compression circuit 100E to the amplifying unit 10C of the third embodiment, the resistors 242p, 244p, 242n, and 244n have a resistance value R3 as shown in FIG. 11, and in a case of applying the dynamic range compression circuit 100E to the amplifying unit 10D of the fourth embodiment, the resistors 242p, 244p, 242n, and 244n have a resistance value of (R3+R4). This is the same for a resistor for voltage division of the first voltage-dependent voltage-dividing circuit (for example, the resistor 123p of the resistors 122p and 123p of FIG. 1).

Further, the second voltage-dependent voltage-dividing circuit 150E includes P-channel transistors 245p and 246p and N-channel transistors 245n and 246n. Here, the P-channel transistor 245p has a source connected to a node between the resistors 241p and 242p, and a drain connected to the power source −VDD. The P-channel transistor 246p has a source connected to a node between the resistors 243p and 244p, and a drain connected to the power source −VDD. The N-channel transistor 245n has a source connected to a node between the resistors 241n and 242n, and a drain connected to the power source +VDD. The N-channel transistor 246n has a source connected to a node between the resistors 243n and 244n, and a drain connected to the power source +VDD.

The first voltage-dependent voltage-dividing circuit which is the voltage-dependent voltage-dividing circuit 120A or 120B generates the gate voltage VGP for making a voltage VBp1 at a node of the resistors 241p and 242p and a voltage VBp2 at a node between the resistors 243p and 244p the input limit voltage +VILMT when the voltage value of the audio input signal VIp or VIn is the input-stage maximum voltage +VIMAX, and supplies the gate voltage VGP to the gates of the P-channel transistors 245p and 246p. Further, the first voltage-dependent voltage-dividing circuit which is the voltage-dependent voltage-dividing circuit 120A or 120B generates the gate voltage VGP for making a voltage VBn1 at a node of the resistors 241n and 242n and a voltage VBn2 at a node between the resistors 243n and 244n the input limit voltage −VILMT when the voltage value of the audio input signal VIp or VIn is the input-stage maximum voltage −VIMAX, and supplies the gate voltage VGP to the gates of the N-channel transistors 245n and 246n.

The peak holding circuit 175p generates a reference voltage Vrefp1 on the basis of a positive peak occurring in the voltage VBp1, and the peak holding circuit 176p generates a reference voltage Vrefp2 on the basis of a positive peak occurring in the voltage VBp2. More specifically, the peak holding circuit 175p repeats an operation to raise the reference voltage Vrefp1 according to a positive peak occurring in the voltage VBp1, and attenuate the reference voltage Vrefp1 according to a sufficiently large time constant until the next positive peak occurs in the voltage VBp1. This is the same for the peak holding circuit 176p.

The peak holding circuit 175n generates a reference voltage Vrefn1 on the basis of a negative peak occurring in the voltage VBn1, and the peak holding circuit 176n generates a reference voltage Vrefp2 on the basis of a negative peak occurring in the voltage VBn2. More specifically, the peak holding circuit 175n repeats an operation to lower the reference voltage Vrefn1 according to a negative peak occurring in the voltage VBn1, and attenuate the reference voltage Vrefn1 according to a sufficiently large time constant until the next negative peak occurs in the voltage VBn1. This is the same for the peak holding circuit 176n.

The attenuation controller 180E includes four comparators 193p, 194p, 193n, and 194n, an OR gate 195, and a circuit corresponding to the time constant circuit 189 of the third embodiment or the attenuation pulse generator 191 of the fourth embodiment.

Here, the comparator 193p compares the voltage V23p at the node between the resistors 12p and 13p and the reference voltage Vrefp1, and outputs a high level when the voltage V23p is higher than the reference voltage Vrefp1, and outputs a low level when the voltage V23p is lower than the reference voltage Vrefp1. The comparator 194p compares the voltage V23n at the node between the resistors 12n and 13n and the reference voltage Vrefp2, and outputs a high level when the voltage V23n is higher than the reference voltage Vrefp2, and outputs a low level when the voltage V23n is lower than the reference voltage Vrefp2. The comparator 193n compares the voltage V23p at the node between the resistors 12p and 13p and the reference voltage Vrefn1, and outputs a high level when the voltage V23p is lower than the reference voltage Vrefn1, and outputs a low level when the voltage V23p is higher than the reference voltage Vrefn1. The comparator 194n compares the voltage V23n at the node between the resistors 12n and 13n and the reference voltage Vrefn2, and outputs a high level when the voltage V23n is lower than the reference voltage Vrefn2, and outputs a low level when the voltage V23n is higher than the reference voltage Vrefn2. The OR gate 195 supplies a logical sum of output signals of the comparators 193p, 194p, 193n, and 194n to the circuit corresponding to the time constant circuit 189 of the third embodiment or the attenuation pulse generator 191 of the fourth embodiment. Further, similarly to the third embodiment or the fourth embodiment, an output signal of the circuit corresponding to the time constant circuit 189 or the attenuation pulse generator 191 is supplied to the attenuator 190.

According to the fifth embodiment, when the voltage value of the audio input signal VIp to the input terminal 1p is the input-stage maximum voltage +VIMAX, and the voltage value of the audio input signal VIn to the input terminal 1n is the input-stage maximum voltage −VIMAX, the voltage VBp1 at the node between the resistors 241p and 242p becomes the input limit voltage +VILMT and the voltage VBn2 at the node between the resistors 243n and 244n becomes the input limit voltage −VILMT. Meanwhile, when the voltage value of the audio input signal VIp to the input terminal 1p is the input-stage maximum voltage −VIMAX, and the voltage value of the audio input signal VIn to the input terminal 1n is the input-stage maximum voltage +VIMAX, the voltage VBp2 at the node between the resistors 243p and 244p becomes the input limit voltage +VILMT and the voltage VBn1 at the node between the resistors 241n and 242n becomes the input limit voltage −VILMT.

Therefore, in a case where the amplitudes of the audio input signals VIp and VIn are the input-stage maximum voltage ±VIMAX, the reference voltages Vrefp1 and Vrefp2 output by the peak holding circuits 175p and 176p become the input limit voltage +VILMT, and the reference voltages Vrefn1 and Vrefp2 output by the peak holding circuits 175n and 176n become the input limit voltage −VILMT. In a case where the voltage V23p at the node between the resistors 12p and 13p or the voltage V23n at the node between the resistors 12n and 13n is higher than the reference voltage Vrefp1 (=Vrefp2=+VILMT) or is lower than the reference voltage Vrefn1 (=Vrefn2=−VILMT), signal attenuation is performed by the attenuator 190. Therefore, as shown in FIGS. 2A and 2B, in the case where the amplitudes of the audio input signals VIp and VIn are the input-stage maximum voltage ±VIMAX, the amplitudes of the audio output signals VOp and VOn output by the amplifying unit 10C or 10D become the output limit voltages ±VOLMT.

In a case where the voltage value of the audio input signal VIp is positive and the voltage value of the audio input signal VIn is negative, if the voltage value of the audio input signal VIp decreases from the input-stage maximum voltage +VIMAX, according to this decrease, the voltage VBp1 at the node between the resistors 241p and 242p decreases, the ON resistance of the P-channel transistor 245p increases, and a voltage division ratio for generating the voltage VBp1 increases toward {R3/(R1+R2+R3)}. Meanwhile, if the voltage value of the audio input signal Vin increases from the input-stage maximum voltage −VIMAX, according to this increase, the voltage VBn2 at the node between the resistors 243n and 244n increases, the ON resistance of the N-channel transistor 246n increases, and a voltage division ratio for generating the voltage VBn2 increases toward {R3/(R1+R2+R3)}. This is the same even in the case where the voltage value of the audio input signal VIp increases from the input-stage maximum voltage −VIMAX and the voltage value of the audio input signal VIn decreases from the input-stage maximum voltage +VIMAX, and voltage division ratios for generating the voltage VBn2 and VBn1 increase toward {R3/(R1+R2+R3)}. Therefore, as the amplitudes of the audio input signals VIp and VLn decrease from the input maximum voltages ±VIMAX, the gain of the amplifying unit 100 or 10D increases toward the maximum gain G0 (=R4/(R1+R2+R3)).

Further, in a range in which the amplitudes of the audio input signals VIp and VIn are equal to or lower than the bending-point input voltage which turns off the P-channel transistors 245p and 246p and the N-channel transistors 245n and 246n, the gain of the amplifying unit 100 or 10D becomes the maximum gain G0 (=R4/(R1+R2+R3)).

As described above, according to the fifth embodiment, the same effects as those the first and second embodiments are obtained.

Although the first to fifth embodiments of the present invention have been described above, other embodiments of the present invention can be considered. For example, other embodiments are as follow.

First, in the first and second embodiments, the positive reference voltage Vrefp and the negative reference voltage Vrefn are generated and the negative feedback control is performed such that the voltage V23 at the node between the resistors 12 and 13 falls within a range between the reference voltages +Vrefp and −Vrefn. However, only the positive reference voltage Vrefp may be generated, a period when the time constant or peak value of the peak holding circuit 171 is maintained may be doubled, and the negative feedback control may be performed such that the voltage V23 at the node between the resistors 12 and 13 falls within the range between the reference voltages+Vrefp and −Vrefn. According to this aspect, a circuit configuration becomes simple.

Second, in the above-mentioned embodiments, the field-effect transistors are used in the first and second voltage-dependent voltage-dividing circuits. However, bipolar transistors may be in the first and second voltage-dependent voltage-dividing circuits.

Third, in each of the above-mentioned embodiments, the attenuator which performs attenuation to reduce the gain of the amplifying unit is provided on an input path of the audio input signals. However, the attenuator may be provided at any other place. For example, two resistors connected in series with each other may take the place of the resistor 14 for performing the negative feedback from the output terminal to the reverse-phase input terminal of the differential amplifier 20 of the first embodiment, and the attenuator may be connected to a node between the two resistors.

Fourth, in the third and fourth embodiments, the voltage-dependent voltage-dividing circuit includes the N-channel transistors 211, 212, and 235. However, the voltage-dependent voltage-dividing circuit may include P-channel transistors.

Fifth, in the first and second embodiments, the gate voltage VGP is set to a positive voltage and the gate voltage VGN is set to a negative voltage, such that the bending point Z is generated in the dynamic range compression characteristic.

However, the gate voltage VGP may be set to a negative voltage and the gate voltage VGN may be set to a positive voltage, such that the bending point Z is not generated in the dynamic range compression characteristic.

Sixth, in each of the above-mentioned embodiments, the output limit voltage VOLMT may be set to the maximum voltage which the amplifying unit can output, or be arbitrarily set by manipulation of a manipulation unit (not shown) or the like in order for power restriction or the like. Alternatively, in a case where the input limit voltage VILMT is set by manipulation of a manipulation unit (not shown) or the like, the output limit voltage VOLMT may be set on the basis of the set input limit voltage VILMT.

Seventh, in each of the above-mentioned embodiments, in order to implement various dynamic range compression characteristics, the input-stage maximum voltages ±VIMAX may be arbitrarily set regardless of a maximum output voltage of the input-stage circuit.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2011-0009195 filed on Jan. 19, 2011, the contents of which are incorporated herein by reference.

What is claimed is:

1. A dynamic range compression circuit comprising:
    an attenuator that attenuates a signal at a predetermined node in an amplifier to reduce a gain of the amplifier; and
    a gain controller that reduces the gain of the amplifier by the attenuator so that an amplitude of an output signal of the amplifier becomes an arbitrary output limit voltage in a case where an input signal having the same amplitude as that of an input-stage maximum voltage of the amplifier is input into the amplifier, and increases the gain of the amplifier by reducing a degree of attenuation of the attenuator according to a decrease of the amplitude of the input signal of the amplifier from the input-stage maximum voltage in a case where the amplitude of the input signal of the amplifier is smaller than the input-stage maximum voltage,
    wherein the gain of the amplifier increased by the gain controller is limited to a predetermined maximum gain, and
    wherein after the gain of the amplifier is increased, the gain controller is configured to adjust an amplitude of an input signal of the amplifier corresponding to the predetermined maximum gain.

2. The dynamic range compression circuit according to claim 1, wherein the gain controller includes:
    a reference voltage generator that generates a reference voltage by dividing the input signal of the amplifier at a voltage division ratio depending on a voltage value of the input signal; and
    an attenuation controller that controls the attenuator to attenuate the signal at the predetermined node in the amplifier so as to reduce the gain of the amplifier if a voltage obtained by dividing the input signal of the amplifier at a predetermined voltage division ratio exceeds the reference value; and
    wherein the reference voltage generator divides the input signal of the amplifier at a voltage division ratio so that a reference voltage, which attenuates the amplitude of the output signal of the amplifier to the output limit voltage, is generated in a case where the amplitude of the input signal of the amplifier is the input-stage maximum voltage of the amplifier, and increases the voltage division ratio for generating the reference voltage according to the decrease of the amplitude of the input signal of the amplifier from the input-stage maximum voltage in the case where the amplitude of the input signal of the amplifier is smaller than the input-stage maximum voltage.

3. The dynamic range compression circuit according claim 2, wherein the reference voltage generator includes first and second voltage-dependent voltage-dividing circuits;

wherein the first voltage-dependent voltage-dividing circuit includes:
first and second resistors that are connected in series with each other and receives the input-stage maximum voltage;
a first voltage-dependent resistor that has a resistance value depending on a control voltage and increasing according to a decrease in a voltage across the first voltage-dependent resistor which is connected to a node between the first resistor and the second resistor and another predetermined node respectively; and
a controller that controls the control voltage for the first voltage-dependent resistor so that a voltage at the node between the first resistor and the second resistor becomes an input limit voltage which is an input voltage of the amplifier for outputting the output limit voltage to the amplifier;

wherein the second voltage-dependent voltage-dividing circuit includes:
third and fourth resistors that are connected in series with each other and receives the input signal of the amplifier; and
a second voltage-dependent resistor that receives the control voltage input to the first voltage-dependent resistor, and has a resistance value depending on the control voltage and increasing according to a decrease in a voltage across the second voltage-dependent resistor which is connected to a node between the third resistor and the fourth resistor and another predetermined node respectively; and wherein the reference voltage is generated on the basis of a voltage at the node between the third resistor and the fourth resistor.

4. The dynamic range compression circuit according to claim 3, wherein the reference voltage generator includes a peak holding circuit that generates the reference voltage by holding a peak of an output signal which is a voltage division result of the second voltage-dependent voltage-dividing circuit.

5. The dynamic range compression circuit according to claim 1, wherein the attenuator attenuates a signal at a node on a path of the input signal of the amplifier.

6. The dynamic range compression circuit according to claim 2, wherein the attenuation controller controls the attenuator to intermittently attenuate the signal at the predetermined node in the amplifier so as to reduce the gain of the amplifier if the voltage obtained by dividing the input signal of the amplifier at the predetermined voltage division ratio exceeds the reference value.

7. The dynamic range compression circuit according to claim 6, further comprising:
an attenuation signal generator that outputs an attenuation signal to the attenuator,
wherein the attenuation controller controls the attenuation signal generator to output the attenuation signal intermittently to the attenuator so that the attenuator intermittently attenuates the signal at the predetermined node in the amplifier so as to reduce the gain of the amplifier if the voltage obtained by dividing the input signal of the amplifier at the predetermined voltage division ratio exceeds the reference value.

8. A class D amplifier comprising:
an amplifier; and
a dynamic range compression circuit including:
an attenuator that attenuates a signal at a predetermined node in the amplifier to reduce a gain of the amplifier; and
a gain controller that reduces the gain of the amplifier by the attenuator so that an amplitude of an output signal of the amplifier becomes an arbitrary output limit voltage in a case where an input signal having the same amplitude as that of an input-stage maximum voltage of the amplifier is input into the amplifier, and increases the gain of the amplifier by reducing a degree of attenuation of the attenuator according to a decrease of the amplitude of the input signal of the amplifier from the input-stage maximum voltage in a case where the amplitude of the input signal of the amplifier is smaller than the input-stage maximum voltage,
wherein the gain of the amplifier increased by the gain controller is limited to a predetermined maximum gain, and
wherein after the gain of the amplifier is increased, the gain controller is configured to adjust an amplitude of an input signal of the amplifier corresponding to the predetermined maximum gain.

* * * * *